(12) United States Patent
Sato et al.

(10) Patent No.: US 7,991,024 B2
(45) Date of Patent: Aug. 2, 2011

(54) EXTERNAL CAVITY WAVELENGTH TUNABLE LASER DEVICE AND OPTICAL OUTPUT MODULE

(75) Inventors: Kenji Sato, Tokyo (JP); Jan De Merli, Tokyo (JP); Kenji Mizutani, Tokyo (JP); Koji Kudo, Tokyo (JP); Shinya Sudo, Tokyo (JP); Mads. L Nielsen, Tokyo (JP)

(73) Assignee: NEC Corporation, Tokyo (JP)

( * ) Notice: Subject to any disclaimer, the term of this patent is extended or adjusted under 35 U.S.C. 154(b) by 446 days.

(21) Appl. No.: 11/994,085

(22) PCT Filed: Jun. 29, 2006

(86) PCT No.: PCT/JP2006/312987
§ 371 (c)(1), (2), (4) Date: Jul. 29, 2008

(87) PCT Pub. No.: WO2007/004509
PCT Pub. Date: Jan. 11, 2007

(65) Prior Publication Data
US 2009/0141747 A1    Jun. 4, 2009

(30) Foreign Application Priority Data
Jul. 1, 2005  (JP) ................................. 2005-193527

(51) Int. Cl.
*H01S 3/13*  (2006.01)
*H01S 3/08*  (2006.01)

(52) U.S. Cl. ............................... 372/20; 372/92; 372/99

(58) Field of Classification Search .................... 372/20, 372/92, 98–99, 102
See application file for complete search history.

(56) References Cited

U.S. PATENT DOCUMENTS

| | | | | |
|---|---|---|---|---|
| 5,949,804 A | * | 9/1999 | Okazaki | 372/32 |
| 2003/0007522 A1 | * | 1/2003 | Li et al. | 372/20 |
| 2003/0161360 A1 | * | 8/2003 | Johnson | 372/20 |
| 2003/0179790 A1 | * | 9/2003 | Bouda et al. | 372/20 |
| 2003/0231688 A1 | * | 12/2003 | Takabayashi | 372/92 |
| 2005/0135439 A1 | * | 6/2005 | Chapman et al. | 372/20 |

(Continued)

FOREIGN PATENT DOCUMENTS

JP         04-069987 A      3/1992

(Continued)

OTHER PUBLICATIONS

Mizutani et al., "Over 15 dBm Fiber-Coupled Power Broadband External Cavity Tunable Laser using a Voltage-Controlled Tunable Mirror", ECOC Proceedings, vol. 4 Th2.4.5, 2004, pp. 868-869.

(Continued)

*Primary Examiner* — Minsun Harvey
*Assistant Examiner* — Phillip Nguyen
(74) *Attorney, Agent, or Firm* — Sughrue Mion, PLLC

(57) ABSTRACT

In an external cavity wavelength tunable laser device including an external cavity (20) which includes a semiconductor optical amplifier (2) and performs laser oscillation operation by feeding back external light, a wavelength tunable mirror (7) having at least a single-peak reflection spectrum characteristic within a laser wavelength tuning range is placed on one end of the external cavity (20), and a Fabry-Perot mode interval determined by the effective length of the external cavity (20) is not less than 1/10 times and not more than 10 times the reflection band full width half maximum of the wavelength tunable mirror (7).

36 Claims, 10 Drawing Sheets

U.S. PATENT DOCUMENTS

2007/0268568 A1* 11/2007 Higashi et al. ............... 359/333

FOREIGN PATENT DOCUMENTS

| | | |
|---|---:|---|
| JP | 5-48200 A | 2/1993 |
| JP | 9-186387 A | 7/1997 |
| JP | 2000-261086 A | 9/2000 |
| JP | 2000-514566 A | 10/2000 |
| JP | 2001-257419 A | 9/2001 |
| JP | 2003-023208 A | 1/2003 |
| JP | 2004-348136 A | 12/2004 |
| JP | 2004-356504 A | 12/2004 |

OTHER PUBLICATIONS

Berger et al., "Widely Tunable, Narrow Optical Bandpass Gaussian Filter Using a Silicon Microactuator", OFC 2003, vol. 1, TuN2, 2003, pp. 252-253.

* cited by examiner

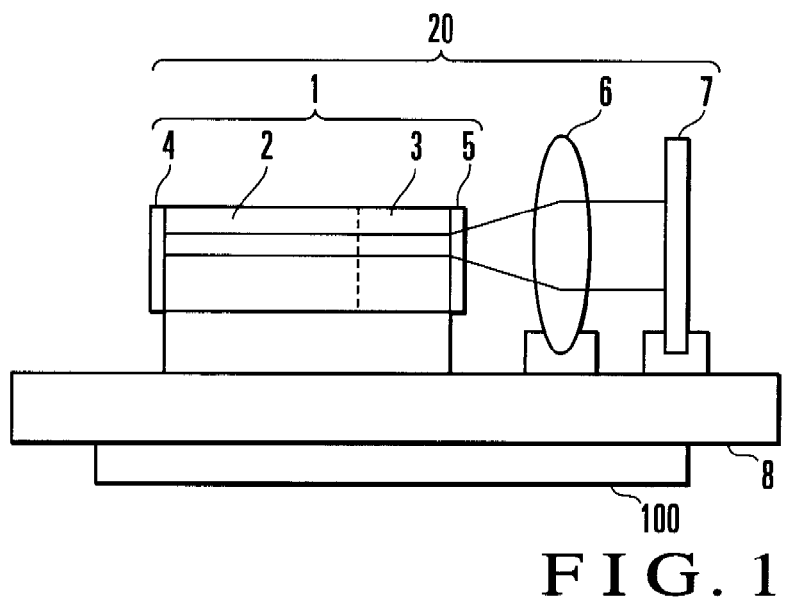
F I G. 1
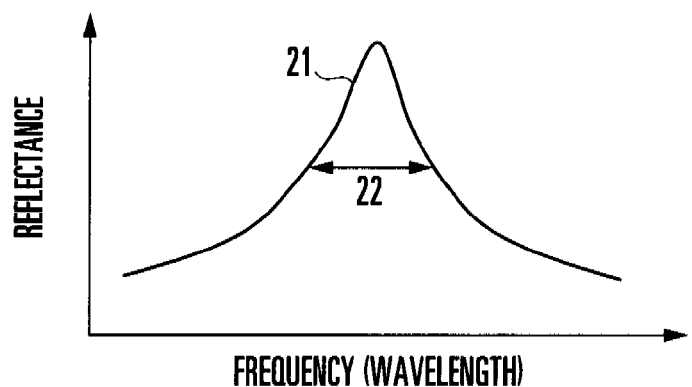
F I G. 2A
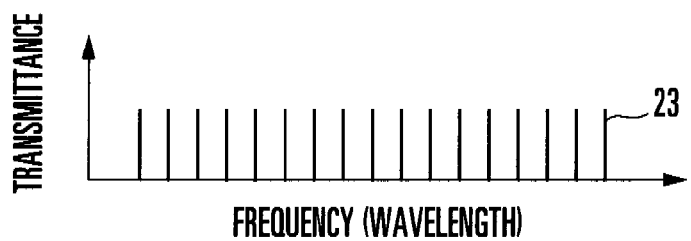
F I G. 2B
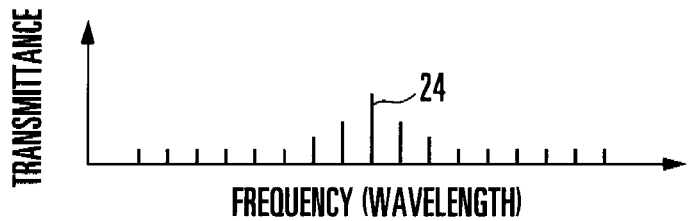
F I G. 2C

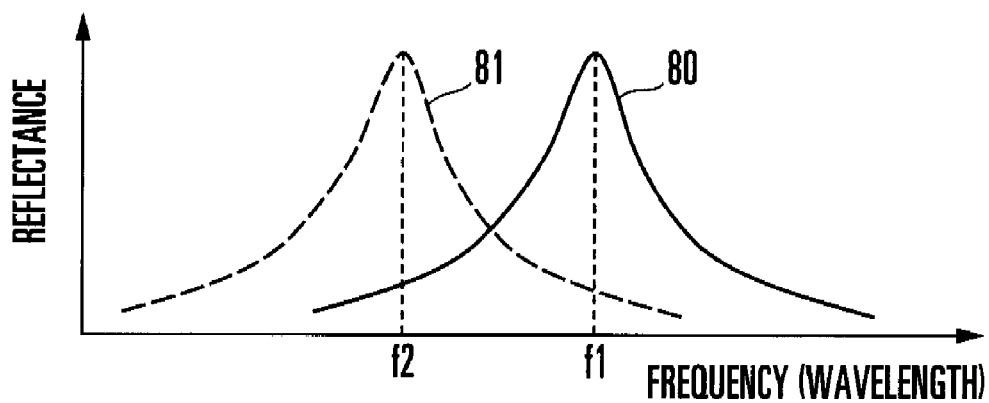
F I G. 10A
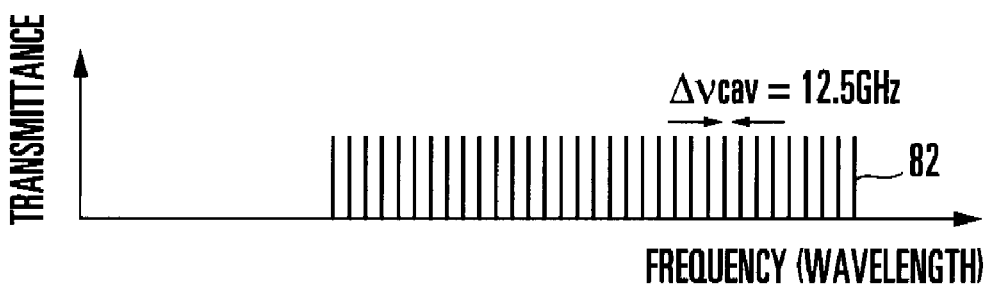
F I G. 10B
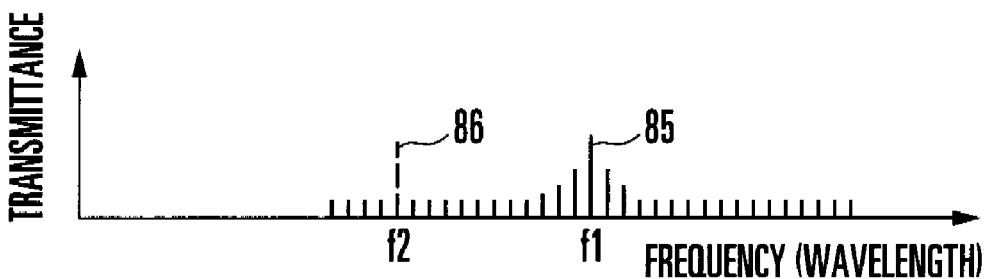
F I G. 10C
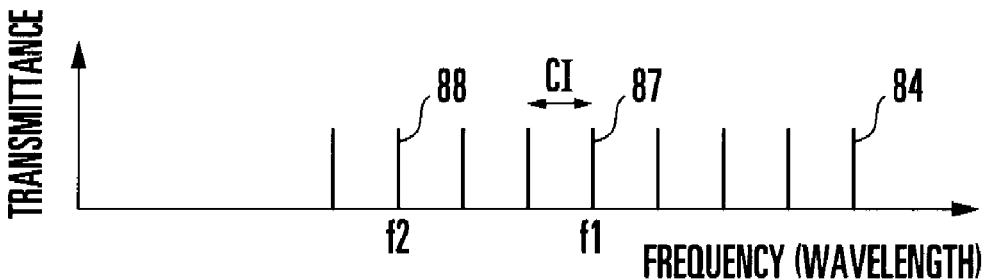
F I G. 10D

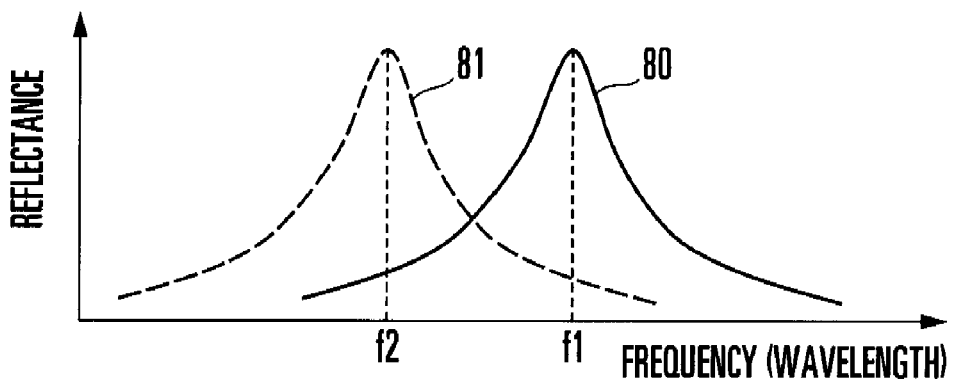
F I G. 11A
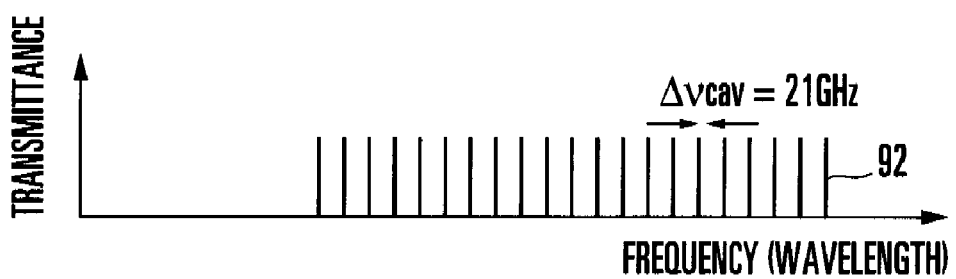
F I G. 11B
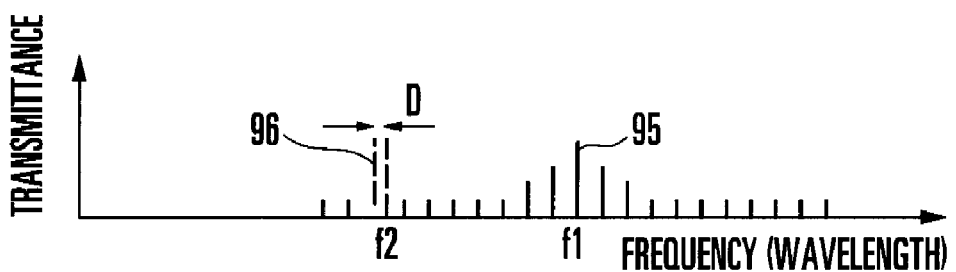
F I G. 11C
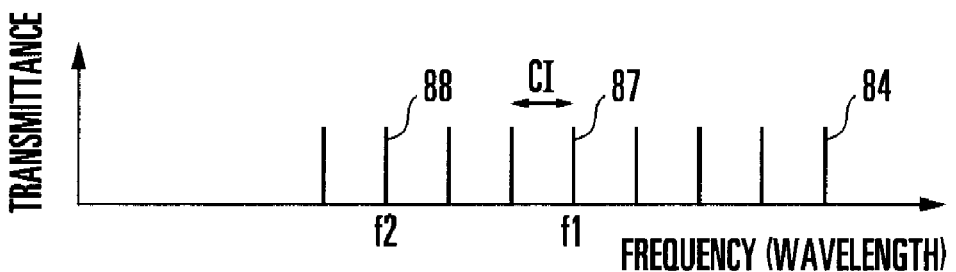
F I G. 11D

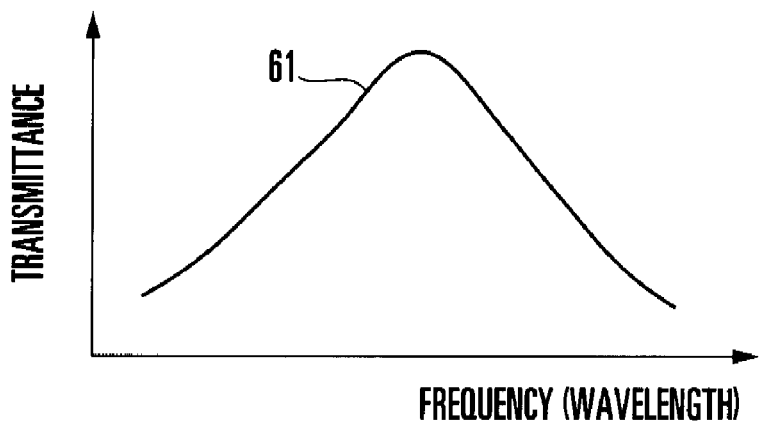
F I G. 14A
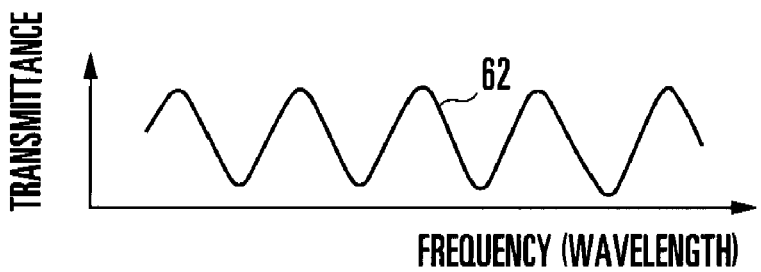
F I G. 14B
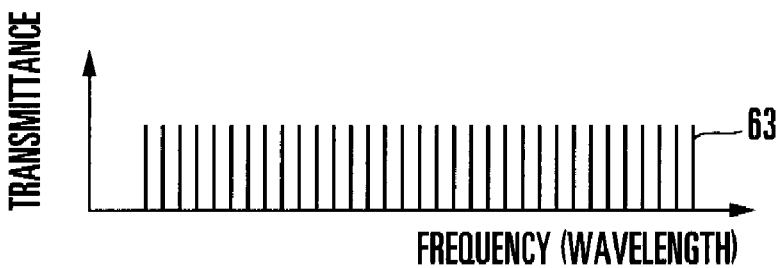
F I G. 14C
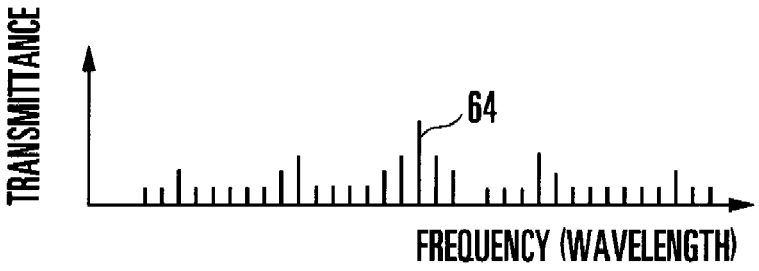
F I G. 14D

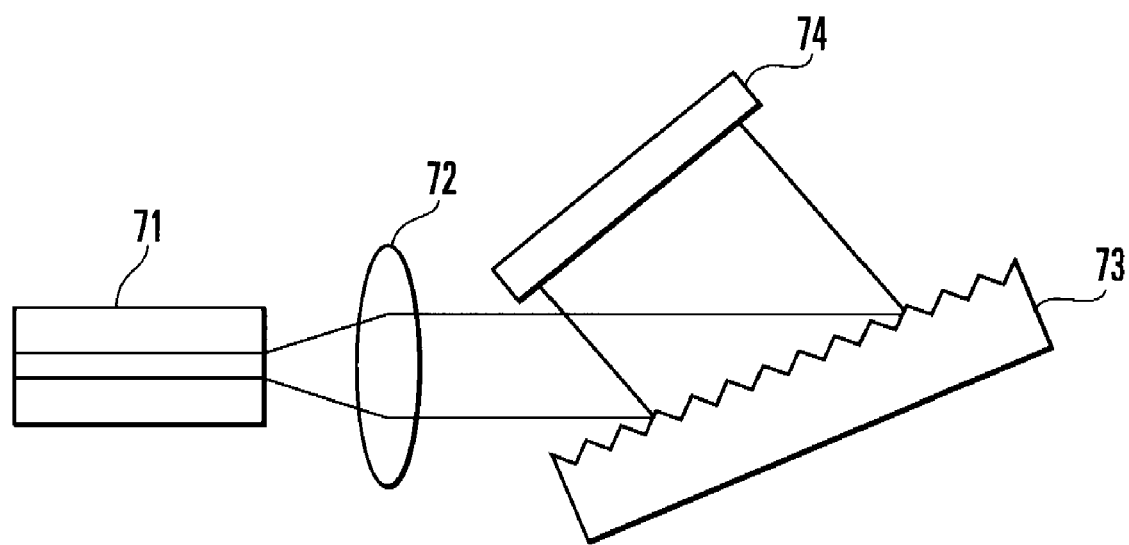
F I G. 15

EXTERNAL CAVITY WAVELENGTH TUNABLE LASER DEVICE AND OPTICAL OUTPUT MODULE

TECHNICAL FIELD

The present invention relates to a mechanism for selecting a desired laser oscillation wavelength in a wavelength division multiplexing optical communication system and, more particularly, to a wavelength tunable laser device having an external cavity structure using a tunable filter and an optical output module including an external cavity wavelength tunable laser device.

BACKGROUND ART

Recently, with the rapid proliferation of the Internet, there has been a demand for a further increase in communication traffic. Under the circumstance, the transmission rate per unit channel in a system has increased as well as the number of channels based on wavelength division multiplexing (to be abbreviated as WDM hereinafter). WDM is a scheme which can simultaneously transmit a plurality of optical signals assigned to different carrier wavelengths (channels), and allows an increase in communication capacity in accordance with the number of channels. The respective channel wavelengths are sufficiently separated from each other. If, for example, data are modulated at 10 gigabits/sec per channel to transmit 100-channel data using one common optical fiber, the communication capacity reaches one terabit/sec.

As a wavelength band used for recent medium/long-distance optical communication, the C-band (1,530 to 1,570 nm) which can be amplified by an optical fiber amplifier (erbium-doped fiber amplifier to be abbreviated as an EDFA hereinafter) is widely used. In general, laser devices are prepared for standard channels used for optical communications in accordance with the respective wavelengths. That is, 100 types of laser devices are required for 100 channels. Because of this arises a problem of increasing the cost of inventory management and stocktaking. For the above reason, there is a demand for the commercialization of a wavelength tunable laser device which can cover alone the C-band as a wavelength band which can be amplified by an EDFA in medium/long-distance communication. If the entire C-band can be covered by one laser device, it allows both the manufacturer and the user to handle only a single type of laser device. This makes it possible to greatly reduce the cost of inventory management and stocktaking.

On the other hand, there is also a demand for the construction of a flexible network which allows dynamic path setting in accordance with changes in traffic and troubles. That is, improvements in the infrastructure of networks capable of providing more diversified services are required. A technique of freely controlling wavelengths is indispensable to construct such a large-capacity, high-performance, high-reliability photonic network. A wavelength tunable laser has therefore become a very important system key device.

As a wavelength tunable laser which satisfies such requirements, Japanese Patent Laid-Open No. 2003-023208 (to be referred to as reference 1 hereinafter) has disclosed a structure in which the oscillation wavelengths of a plurality of distributed feedback (to be abbreviated as DFB) lasers arranged in parallel are shifted in advance, coarse wavelength adjustment is performed by switching the lasers, and fine wavelength adjustment is performed by using changes in refractive index with changes in temperature. According to the wavelength tunable laser disclosed in reference 1, output ports must be coupled as one port to an optical fiber, and hence it is necessary to use an optical coupler which couples the output ports of the respective DFB lasers into one output port. If, therefore, the number of DFB lasers arranged in parallel increases, the loss in the optical coupler increases. That is, there is a tradeoff relationship between wavelength tuning range and optical output power.

A wavelength tunable laser based on a DFB laser allows fine adjustment based on temperature, and hence can be used in combination with the wavelength locker disclosed in Japanese Patent Laid-Open No. 2001-257419 (to be referred to as reference 2 hereinafter). A wavelength locker is an etalon-type filter having a periodic transmission amplitude on the frequency axis. Since the transmitted light intensity of the etalon-type filter sensitively changes in accordance with the laser frequency near the amplitude center, it is possible to tune the laser frequency to a desired laser frequency by detecting a transmitted light intensity with a monitor current in a photoelectric conversion element. As described above, a combination of a DFB laser and a wavelength locker is an effective means for accurately locking the laser wavelength to a standard channel wavelength.

As a wavelength tunable laser which is free from the above tradeoff relationship and satisfies the requirement of freely controlling wavelengths, an external cavity wavelength tunable laser is proposed, which forms an external cavity by using a semiconductor optical amplifier and an external reflecting mirror, and implements a wavelength selection characteristic by inserting a wavelength tunable filter, a wavelength tunable mirror, and the like in the external cavity. This external cavity wavelength tunable laser can relatively easily obtain a wavelength tuning range which covers the entire C-band, and hence has been extensively researched and developed.

Most of the basic characteristics of an external cavity wavelength tunable laser are determined by a wavelength tunable filter and a wavelength tunable mirror inserted in a cavity. Therefore, various wavelength tunable filters and wavelength tunable mirrors having excellent characteristics have been developed. As wavelength tunable filters, there are available, for example, a filter designed to rotate an etalon which is disclosed in Japanese Patent Laid-Open No. 4-69987 (to be referred to as reference 3 hereinafter), a filter designed to rotate a diffraction grating which is disclosed in Japanese Patent Laid-Open No. 5-48200 (to be referred to as reference 4 hereinafter), and an acoustooptic filter and dielectric filter disclosed in Japanese Patent Laid-Open No. 2000-261086 (to be referred to as reference 5). As a wavelength tunable mirror, for example, there is available an electrically controlled wavelength tunable mirror with an external mirror itself having a wavelength tunable characteristic which is disclosed in U.S. Pat. No. 6,215,928B1 (to be referred to as reference 6 hereinafter).

There are various types of methods of forming an external cavity wavelength tunable laser by using a wavelength tunable filter or wavelength tunable mirror. The following arrangements are effective in implementing a high-performance light source: an arrangement obtained by combining a gain medium such as a semiconductor optical amplifier, a wavelength selection filter having a periodic transmission characteristic on the frequency axis (to be abbreviated as a wavelength selection filter hereinafter), a wavelength tunable filter, and a reflecting mirror as disclosed in reference 5; and an arrangement obtained by combining a wavelength selection filter and a wavelength tunable mirror as disclosed in "K. Mizutani, et al., "Over 15 dBm Fiber-Coupled Power Broadband External Cavity Tunable Laser using a Voltage-Controlled Tunable Mirror", ECOC (European Conference on Optical Communication) Proceedings, Vol. 4, Th2.4.5, 2004, pp. 868-869" (to be referred to as reference 7 hereinafter). As a wavelength selection filter, an etalon having a periodic transmission characteristic on the frequency axis is used. As a wavelength tunable filter, an acoustooptic filter is used. As a wavelength tunable mirror, an electrically controlled wavelength tunable mirror is used.

The principle of wavelength selection operation by an external cavity wavelength tunable laser will be briefly described with reference to FIGS. 13, 14A, 14B, 14C, and 14D. FIG. 13 is a side view showing the arrangement of a conventional external cavity wavelength tunable laser device. FIGS. 14A, 14B, 14C, and 14D are views for explaining the laser oscillation modes of the external cavity wavelength tunable laser device in FIG. 13. Referring to FIG. 13, reference numeral 51 denotes a semiconductor element; 52, a semiconductor optical amplifier 52; 53, a low-reflection coated surface; 54, a nonreflective coated surface; 55, collimating lens; 56, etalon; 57, a wavelength tunable filter; 58, a total reflection mirror; 59, a subcarrier; and 101, a temperature controller. The low-reflection coated surface 53, semiconductor optical amplifier 52, nonreflective coated surface 54, collimating lens 55, etalon 56, wavelength tunable filter 57, and total reflection mirror 58 constitute an external cavity. FIG. 14A is a graph showing the transmission characteristic of the wavelength tunable filter 57. FIG. 14B is a graph showing the transmission characteristic of the etalon 56. The 14C is a graph showing the Fabry-Perot modes of the external cavity. FIG. 14D is a graph showing the laser oscillation modes of the external cavity.

Light output from the semiconductor optical amplifier 52 as a gain medium contains many Fabry-Perot modes 63 dependent on the total length of the external cavity, as shown in FIG. 14C. Of these modes, only a plurality of modes which coincide with the period of a periodic transmission band 62 (FIG. 14B) of the etalon 56 as a wavelength selection filter are selected and made to pass through the wavelength selection filter. At this time, since the Fabry-Perot modes which cannot transmit the wavelength selection filter are suppressed, this filter has a merit of easily suppressing sub-modes other than a channel even in an arrangement in which the frequency intervals between Fabry-Perot modes are relatively short, i.e., the total length of the external cavity is relatively large.

The wavelength tunable filter 57 having a transmission characteristic 61 shown in FIG. 14A selects only one of a plurality of modes transmitted through the wavelength selection filter. The selected mode is then transmitted through the wavelength tunable filter 57. Reference numeral 64 in FIG. 14D denotes a mode which is transmitted through the wavelength tunable filter 57. The light transmitted through the wavelength tunable filter 57 is reflected by the total reflection mirror 58, and finally returns to the semiconductor optical amplifier 52. In this manner, a feedback loop is formed. The arrangement in FIG. 13 can relatively easily implement a wavelength tunable laser with high mode stability. In addition, a wavelength selection characteristic can be implemented by relatively simple control.

In the arrangement shown in FIG. 13, the periodic wavelength of the wavelength selection filter is fixed, and the wavelength at a transmission peak coincides with a standard channel for optical communication. According to the arrangement in FIG. 13, since the wavelength selection filter is placed inside the external cavity, a wavelength accuracy can be obtained within the channel accuracy of the wavelength selection filter without using any wavelength locker required in a wavelength tunable DFB laser.

In addition, according to the arrangement in FIG. 13, arranging the filter, the mirror, and the like to make a light beam emitting from the semiconductor optical amplifier linearly travel can miniaturize the external cavity. This facilitates physical placement for achieving a desired cavity mode interval even in an actual implementation step. That is, this can be said to be an excellent arrangement. Such an arrangement is typified by the laser device disclosed in Japanese Patent Laid-Open No. 2004-356504 (to be referred to as reference 8 hereinafter).

However, the external cavity wavelength tunable lasers disclosed in references 5 and 8 also include several problems.

The first problem is that such an arrangement is not suitable for the implementation of a high power laser. This is because, since the wavelength selection filter is inserted between the semiconductor optical amplifier and the total reflection mirror, optical loss occurs when light is transmitted through the wavelength selection filter, resulting in interference with an increase in the power of the laser.

The reason why the conventional external cavity wavelength tunable laser is not suitable for an increase in power will be described in more detail. As described above, an etalon is a typical example of a wavelength selection filter. An etalon generally has a Fabry-Perot structure in which two opposing reflecting mirrors are arranged at a given fixed interval. A simplest example is a glass cube. The interface between the glass and the air functions as a reflecting mirror. The thickness of the glass cube is the fixed interval. Since light is repeatedly reflected between these two reflecting mirrors, optical resonance occurs. In this case, a transmission peak repeatedly appears with respect to the frequency (wavelength) of light, and a period FSR (Free Spectral Range) can be expressed by $$FSR=C/(2nd) \quad (1)$$

where C is a light velocity (300,000 km/s). If, for example, the refractive index and thickness of the glass are n=1.5 and d=2 mm, respectively, the period FSR of transmission peaks is just 50 GHz. That is, the period FSR can be made to coincide with the standard channel interval.

As described above, a channel wavelength at which light is completely transmitted through the etalon due to interference periodically exits in the etalon. That is, when light with other wavelengths strike the etalon, the optical power is partly or totally reflected due to interference. In addition, if the reflecting surface of the etalon is perfectly vertical to a light beam, light with the periodic channel wavelength is completely transmitted through the etalon. On the other hand, when an optical power component which is not transmitted through the etalon is reflected by the etalon and returns to the semiconductor optical amplifier, the light interferes with the laser oscillation mode stability. In practice, therefore, the etalon is tilted with respect to a light beam to prevent reflected light from the etalon from returning to the semiconductor optical amplifier.

If, however, the etalon is tilted with respect to a light beam, the light beam inside the etalon causes a positional shift every time it is reflected, resulting in a reduction in interference effect. For this reason, even light with a wavelength which is perfectly transmitted through the etalon is not partly used for interference and emits. This is the reason for optical loss. Loss always occurs in such a wavelength selection filter in addition to an etalon. This causes excessive optical loss for the external cavity, and hence hinders an increase in laser power.

The second problem in the conventional external cavity wavelength tunable laser is that some limitation is imposed on wavelength accuracy obtained with respect to the standard channel wavelength. The reason why some limitation is imposed on wavelength accuracy will be described in detail below. The external cavity wavelength tunable laser using the wavelength selection filter is accompanied by a mechanism of performing phase adjustment for the laser oscillation mode using some method. As disclosed in reference 7, in some case, a phase adjustment mechanism is integrated with a semiconductor optical amplifier. Using the phase adjustment mechanism makes it possible to finely adjust a laser oscillation wavelength. In general, since the transmission peak wavelength of the wavelength selection filter is made to coincide with the standard channel used in optical communication, the laser oscillation wavelength is simply controlled to minimize loss in the wavelength selection filter. That is, in practice, control is performed to maximize the laser oscillation power near the transmission peak wavelength of the wavelength selection filter.

However, since the change amount of optical power is small near the transmission peak of the wavelength selection filter, it is difficult to make the laser oscillation wavelength perfectly coincide with the transmission peak of the wavelength selection filter by the above control operation of maximizing optical power. That is, a certain degree of error is unavoidable. Therefore, in comparison with the structure having the wavelength lock mechanism added to the outside of the laser cavity disclosed in reference 2, some limitation is imposed on wavelength accuracy with respect to the standard channel. In general, errors reach about several GHz. Such an error is worse by one order of magnitude or more than the wavelength accuracy based on the wavelength lock mechanism disclosed in reference 2.

The third problem in the conventional external cavity wavelength tunable laser is that the frequency modulation (FM modulation) efficiency is low. This is because the laser oscillation wavelength is locked to the periodic transmission peak wavelength of the wavelength selection filter. The reason why the FM modulation efficiency is low will be described in detail below. The wavelength selection filter internally has a resonance structure like an etalon. Therefore, light reciprocates most often inside the etalon near the wavelength at which light is transmitted most, and the effective optical path length increases manifolds. For this reason, the behavior of wavelength becomes insensitive to laser phase control, i.e., optical path length adjustment.

In recent optical fiber communication, it is known that optical loss in the optical fiber can be reduced by intentionally FM-modulating a laser oscillation wavelength so as to suppress stimulated Brillouin scattering (SBS) in the optical fiber. If, however, a wavelength selection filter is used, the FM modulation efficiency decreases, and SBS cannot be suppressed, resulting in an increase in loss in the optical fiber. This poses a problem in long-distance communication.

The fourth problem of the conventional external cavity wavelength tunable laser is that continuous wavelength tuning operation cannot be performed. This is because laser oscillation is allowed only near the periodic transmission peak wavelength of the wavelength selection filter. This indicates that as the wavelength channel interval decreases and the channel density becomes high in the future, the laser cannot cope with an increase in channel density.

The fifth problem of the conventional external cavity wavelength tunable laser is that the cost is high. As described above, in consideration of the actual application of the laser to a DWDM optical communication system, it is necessary to make the oscillation wavelength always coincide with the standard channel. For this purpose, a basic component always requires a phase adjustment mechanism, and it is necessary to finely adjust the wavelength by using the phase adjustment mechanism at the time of channel wavelength setting. This means that the optical arrangement of the external cavity wavelength tunable laser and its control circuit arrangement become complicated. This becomes a factor that increases the cost and decreases the wavelength switching speed.

As a laser which partly solves the above problem, there is available the external cavity wavelength tunable laser disclosed in J. Berger, et al., "Widely Tunable, Narrow Optical Bandpass Gaussian Filter Using a Silicon Microactuator", OFC (Optical Fiber Communication Conference) 2003, VOL. 1, TuN2, 2003, pp. 252-253 (to be referred to as reference 9 hereinafter). FIG. 15 shows the arrangement of this external cavity wavelength tunable laser. The external cavity wavelength tunable laser in FIG. 15 comprises a semiconductor optical amplifier 71, collimating lens 72, variable-angle diffraction grating wavelength tunable filter 73, and variable-angle total reflection mirror 74. As a laser having the same arrangement, an external cavity wavelength tunable laser using a variable-angle micro-etalon wavelength tunable filter is disclosed in Japanese Patent Laid-Open No. 2004-348136 (to be referred to as reference 10 hereinafter). The external cavity wavelength tunable laser disclosed in references 9 and 10 do not use any wavelength selection filter such as an etalon, the first, third, and fourth problems of the first to fifth problems can be solved.

DISCLOSURE OF INVENTION

Problem to be Solved by the Invention

The structure of the external cavity wavelength tunable laser disclosed in references 9 and 10 has a problem that it is difficult to suppress Fabry-Perot modes near a desired channel wavelength. It is generally known that as the cavity length increases, the Fabry-Perot mode interval decreases, and laser oscillation modes become unstable. That is, laser oscillation modes cannot be expected to have high stability in the external cavity wavelength tunable laser disclosed in references 9 and 10.

In the external cavity wavelength tunable laser disclosed in references 9 and 10, a light beam emitting from the semiconductor optical amplifier does not linearly travel. This laser has a complicated structure in which the light beam is reflected and bent by a movable diffraction grating wavelength tunable filter. It is therefore necessary to prevent the light beam from being vignetted by each element in sufficient consideration of the arrangement of the respective elements, and hence it is difficult to miniaturize the external cavity. For this reason, it is difficult to check from only a physical arrangement whether the Fabry-Perot mode interval determined by the cavity length is sufficiently large, and hence it is necessary to perform adjustment again after implementation by using movable components such as micromachines (MEMS).

It is an object of the present invention to solve the above problems and provide an external cavity wavelength tunable laser which can achieve high laser mode stability, high optical power, high wavelength accuracy, and high FM modulation efficiency and allows reductions in cost and size.

Means of Solution to the Problem

An external cavity wavelength tunable laser device of the present invention is characterized by comprising an external cavity which includes a semiconductor optical amplifier and performs laser oscillation operation by feeding back external light, and a wavelength tunable mirror which is placed on one end of the external cavity and has at least a single-peak reflection spectrum characteristic within a laser wavelength tuning range, wherein a Fabry-Perot mode interval determined by an effective length of the external cavity is not less than 1/10 times and not more than 10 times a reflection band full width half maximum of the wavelength tunable mirror.

In addition, an external cavity wavelength tunable laser device of the present invention is characterized by comprising an external cavity which includes a semiconductor optical amplifier and a total reflection mirror which performs laser oscillation operation by feeding back external light, and a transmitting wavelength tunable filter which is placed between the semiconductor optical amplifier and the total reflection mirror and has at least a single-peak transmission spectrum characteristic within a laser wavelength tuning range, wherein a Fabry-Perot mode interval determined by an effective length of the external cavity is not less than 1/10 times and not more than 10 times a transmission band full width half maximum of the wavelength tunable filter.

EFFECTS OF THE INVENTION

According to the present invention, in the external cavity wavelength tunable laser device comprising the external cavity which includes the semiconductor optical amplifier and performs laser oscillation operation by feeding back external light, the wavelength tunable mirror having at least a single-peak reflection spectrum characteristic within the laser wavelength tuning range is placed on one end of the external cavity, and the Fabry-Perot mode interval determined by the effective length of the external cavity is not less than 1/10 times and not more than 10 times the reflection band full width half maximum of the wavelength tunable mirror. With this arrangement, the following effects can be obtained. The first effect is that an external cavity wavelength tunable laser device which has high laser mode stability and performs high optical power operation can be implemented. This is because this arrangement is configured to minimize loss in the external cavity and give consideration to the laser mode. As compared with the same optical power of the conventional external cavity wavelength tunable laser device, a reduction in driving current can be achieved. The second effect is that this device can obtain the same high wavelength accuracy as that obtained by a distributed feedback semiconductor laser having a wavelength locker mounted outside a laser cavity. This is because the present invention also allows a wavelength locker to be mounted outside the laser cavity. The third effect is that high frequency modulation (FM modulation) efficiency can be obtained. This is because no narrow-band filter like a wavelength selection filter is used to facilitate FM modulation. This makes it possible to suppress stimulated Brillouin scattering in an optical fiber and implement long-distance communication. The fourth effect is that this device can continuously change the laser oscillation wavelength, and can easily cope with a case in which the channel intervals for wavelength division multiplexing communication decrease in the future. The fifth effect is that the number of laser parts can be reduced, and the phase adjustment mechanism can be simplified, thereby implementing a low-cost, easily controllable wavelength tunable laser. In addition, obviating the necessity of phase adjustment can increase wavelength switching speed. With the above first to fifth effects, the present invention can implement a low-cost external cavity wavelength tunable laser device suitable for long-distance communication which suppresses power consumption, and achieves high channel wavelength accuracy.

In addition, according to the present invention, in the external cavity wavelength tunable laser device comprising the external cavity which includes the semiconductor optical amplifier and the total reflection mirror which performs laser oscillation operation by feeding back external light, the wavelength tunable filter having at least a single-peak transmission spectrum characteristic within the laser wavelength tuning range is placed between the semiconductor optical amplifier and the total reflection mirror, and the Fabry-Perot mode interval determined by an effective length of the external cavity is not less than 1/10 times and not more than 10 times the transmission band full width half maximum of the wavelength tunable filter. With this arrangement, the first to fifth effects can be obtained.

BRIEF DESCRIPTION OF DRAWINGS

FIG. 1 is a side view showing the arrangement of an external cavity wavelength tunable laser device according to the first embodiment of the present invention;

FIG. 2A is a graph for explaining the laser oscillation modes of the external cavity wavelength tunable laser device in FIG. 1, showing the reflection characteristic of a wavelength tunable mirror;

FIG. 2B is a graph for explaining the laser oscillation modes of the external cavity wavelength tunable laser device in FIG. 1, showing the Fabry-Perot modes of an external cavity;

FIG. 2C is a graph for explaining the laser oscillation modes of the external cavity wavelength tunable laser device in FIG. 1, showing the laser oscillation modes of the external cavity;

FIG. 10A is a graph for explaining the laser oscillation modes of the external cavity wavelength tunable laser device in FIG. 9, showing the reflection characteristic of a wavelength tunable mirror;

FIG. 10B is a graph for explaining the laser oscillation modes of the external cavity wavelength tunable laser device in FIG. 9, showing the Fabry-Perot modes of an external cavity;

FIG. 10C is a graph for explaining the laser oscillation modes of the external cavity wavelength tunable laser device in FIG. 9, showing the laser oscillation modes of the external cavity;

FIG. 10D is a graph for explaining the laser oscillation modes of the external cavity wavelength tunable laser device in FIG. 9, showing channel intervals;

FIG. 11A is a graph for explaining conventional laser oscillation modes of the external cavity wavelength tunable laser device, showing the reflection characteristic of a wavelength tunable mirror;

FIG. 11B is a graph for explaining the laser oscillation modes of the conventional external cavity wavelength tunable laser device, showing the Fabry-Perot modes of an external cavity;

FIG. 11C is a graph for explaining the laser oscillation modes of the conventional external cavity wavelength tunable laser device, showing the laser oscillation modes of the external cavity;

FIG. 11D is a graph for explaining the laser oscillation modes of the conventional external cavity wavelength tunable laser device, showing channel intervals;

FIG. 14A is a graph for explaining the laser oscillation modes of the external cavity wavelength tunable laser device in FIG. 13, showing the transmission characteristic of a wavelength tunable filter;

FIG. 14B is a graph for explaining the laser oscillation modes of the external cavity wavelength tunable laser device in FIG. 13, showing the transmission characteristic of an etalon;

FIG. 14C is a graph for explaining the laser oscillation modes of the external cavity wavelength tunable laser device in FIG. 13, showing the Fabry-Perot modes of an external cavity;

FIG. 14D is a graph for explaining the laser oscillation modes of the external cavity wavelength tunable laser device in FIG. 13, showing the laser oscillation modes of the external cavity; and FIG. 15 is a plan view showing another arrangement of the conventional external cavity wavelength tunable laser device.

BEST MODE FOR CARRYING OUT THE INVENTION

First Embodiment

Figure 3:
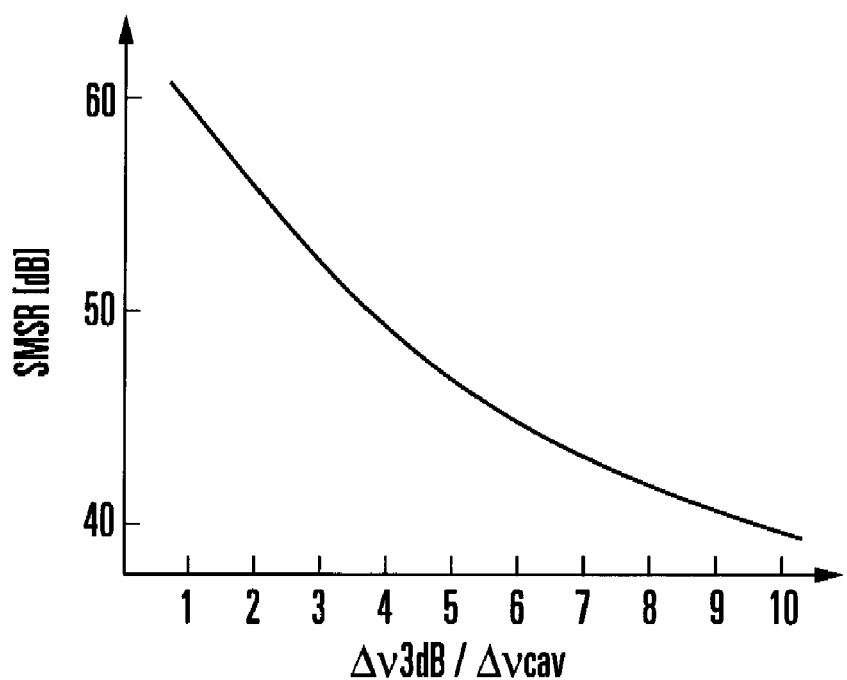
FIG. 3 is a graph showing a sub-mode suppression ratio with respect to the ratio between the reflection band full width half maximum of the wavelength tunable mirror and the Fabry-Perot mode interval of the external cavity in the first embodiment of the present invention.

The embodiments of the present invention will be described below with reference to the accompanying drawings. FIG. 1 is a side view showing the arrangement of an external cavity wavelength tunable laser according to the first embodiment of the present invention. This embodiment is configured not to use any wavelength selection filter in order to prevent optical loss due the use of a wavelength selection filter. An external cavity wavelength tunable laser according to this embodiment comprises a semiconductor element 1 including a semiconductor optical amplifier 2, a collimating lens 6, and a wavelength tunable mirror 7 whose reflection characteristic within the operating wavelength band is not periodic.

The semiconductor element 1 is obtained by integrating a phase adjustment area 3 as a passive element with the semiconductor optical amplifier 2 as an active element. In this embodiment, laser light is output from the left end face of the semiconductor optical amplifier 2. A low-reflection coating 4 with a reflectance of 1 to 10% is formed on the left end face of the semiconductor optical amplifier 2. A nonreflective coating 5 with a reflectance of 1% or less is formed on the right end face of the phase adjustment area 3. The low-reflection coating 4, semiconductor optical amplifier 2, phase adjustment area 3, nonreflective coating 5, collimating lens 6, and wavelength tunable mirror 7 constitute an external cavity 20. Although the end face of the semiconductor optical amplifier 2 which is located on the opposite side to the phase adjustment area 3 is an optical output side in this embodiment, the end face of the phase adjustment area 3 which is located on the opposite side to the semiconductor optical amplifier 2 may be optical output side.

The semiconductor optical amplifier 2 as an active element is formed by a multiple quantum well (MQW), and generates/amplifies light in accordance with the injection of a current. The phase adjustment area 3 as a passive element is formed by a bulk composition or a multiple quantum well, and is an area in which the band gap is increased to such an extent that laser oscillation light is not absorbed. The refractive index of the area changes with injection of a current or application of a voltage. It suffices to use a known butt joint technique or a known selective growth technique to manufacture the semiconductor optical amplifier 2 and the phase adjustment area 3. The semiconductor optical amplifier 2 is sufficiently electrically separated from the phase adjustment area 3 to set a separation resistance of 1 kΩ or more in consideration of the prevention of interference of a current between them.

The collimating lens 6 is placed on the opposite side to the optical output side of the semiconductor element 1. The collimating lens 6 converts light beams from the semiconductor element 1 into parallel light. The beam collimated by the collimating lens 6 is reflected by the wavelength tunable mirror 7 and fed back to the semiconductor element 1.

The respective elements constituting the external cavity 20 are arranged on a common subcarrier 8 so as to make a light beam linearly travel. The subcarrier 8 is placed on a temperature controller (Thermo-Electric Cooler: TEC) 100. In addition, although not illustrated in FIG. 1, a thermistor for temperature monitoring, a PD (Photo Detector) for optical power monitoring, and the like are arranged at proper positions.

The laser mode selection principle of the external cavity wavelength tunable laser according to this embodiment will be described next with reference to FIGS. 2A, 2B, and 2C. FIGS. 2A, 2B, and 2C are graphs for explaining the laser oscillation modes of the external cavity wavelength tunable laser of the embodiment. FIG. 2A is a graph showing the reflection characteristic of the wavelength tunable mirror 7. FIG. 2B is a graph showing the Fabry-Perot modes of the external cavity 20. FIG. 2C is a graph showing the laser oscillation modes of the external cavity 20. Note that the abscissa of each of FIGS. 2A, 2B, and 2C represents frequency. Each abscissa does not indicate the entire range to be used, but is an enlarged view of part of the range on the frequency axis.

An effective length nL of the external cavity 20 is defined as follows. The effective length nL is defined as the sum of the products of refractive indexes ni and real lengths Li of the respective elements constituting the laser cavity. That is, the effective length nL is expressed by $$nL = \Sigma(ni \times Li) \quad (2)$$

A Fabry-Perot mode interval Δνcav determined by the effective length nL of the external cavity 20 is determined by $$\Delta \nu cav = C/(2nL) \quad (3)$$

In this case, λ is the wavelength of the laser. Light velocity C=ν×λ (ν is the frequency of light, and λ is the wavelength of light). According to equation (3), as the effective length nL of the external cavity 20 increases, the Fabry-Perot mode interval Δνcav decreases. It is therefore generally known that the sub-mode suppression ratio of the laser decreases.

FIG. 2A shows a reflection spectrum 21 of the wavelength tunable mirror 7. The wavelength tunable mirror 7 theoretically exhibits a reflection peak for a long period of time, and only one reflection peak exists in the C-band used in medium/long-distance optical communication. For example, a reflection band full width half maximum (to be abbreviated as FWHM hereinafter) 22 which is a spectrum width at an intensity ½ the reflection peak of the wavelength tunable mirror 7 is 100 GHz, and the operating wavelength band is 4 THz.

The intervals between Fabry-Perot modes 23 (FIG. 2B) determined by the effective length nL of the external cavity 20 are 20 GHz. Therefore, the effective length nL is about 5 mm. In this case, it is possible to obtain a sufficient sub-mode suppression ratio without using any wavelength selection filter as in the conventional external cavity wavelength tunable laser if the effective length nL of the external cavity 20 is set to have the Fabry-Perot mode interval Δνcav which is about ⅕ the FWHM 22 of the wavelength tunable mirror 7. Consequently, a laser oscillation mode 24 shown in FIG. 2C can be obtained.

If, however, the Fabry-Perot mode interval Δνcav is too small relative to the FWHM 22 of the wavelength tunable mirror 7, stable laser oscillation cannot be implemented. The reason why stable laser oscillation cannot be implemented will be described with reference FIG. 3. Referring to FIG. 3, the abscissa represents the value obtained by dividing the FWHM (Δν3 dB) of the wavelength tunable mirror 7 by the Fabry-Perot mode interval Δνcav; and the ordinate, the result of simulation of the sub-mode suppression ratio (SMSR) of the laser with respect to the abscissa.

As shown in FIG. 3, if the Fabry-Perot mode interval Δνcav is 1/10 or more the FWHM of the wavelength tunable mirror 7, the sub-mode suppression ratio of the laser is 40 dB or more. As described above, if the FWHM of the wavelength tunable mirror 7 is 100 GHz, and the Fabry-Perot mode interval Δνcav is 20 GHz, Δνcav is ⅕ the FWHM. It is therefore obvious from FIG. 3 that a sub-mode suppression ratio of 45 dB or more is obtained.

A value of 40 dB is generally known as the necessary minimum value as the degree of mode stability obtained for a carrier laser for long distance optical communication, Referring to FIG. 3, as the value on the abscissa decreases, the sub-mode suppression ratio tends to increase. From a common sense viewpoint, since this arrangement includes elements whose lengths do not become 0, such as the semiconductor element and the collimating lens, the Fabry-Perot mode interval will never become infinite. For example, the semiconductor element needs to have at least a length of 300 μm or more, and the distance to the external mirror is larger than 0, Δνcav does not exceed 100 GHz. In contrast, as the FWHM of the wavelength tunable mirror 7 decreases, the loss increases. The FWHM is therefore set to at least 10 GHz or more. For this reason, it is appropriate that the ratio between the FWHM of the wavelength tunable mirror 7 and the Fabry-Perot mode interval Δνcav is 10 or less at most.

As described above, this embodiment does not use any wavelength selection filter like that used in the prior art, and hence can avoid optical loss due to the wavelength selection filter and increase laser optical power as compared with the prior art. In addition, the embodiment improves mode stability by decreasing the effective cavity length and increasing the Fabry-Perot mode interval. That is, the embodiment is characterized in that the Fabry-Perot mode interval is set to be 1/10 times or more and 10 times or less the FWHM of the wavelength tunable mirror 7. With this setting, the embodiment can obtain a sub-mode suppression ratio of 40 to 60 dB.

In addition, this embodiment can further stabilize the laser oscillation mode by setting the Fabry-Perot mode interval to be ½ or more the FWHM of the wavelength tunable mirror 7. At this time, the reflectance of the wavelength tunable mirror 7 in the sub-mode becomes ½ or less that at the reflection peak wavelength of the wavelength tunable mirror 7. This indicates that a mode gain difference of 3 dB or more can be obtained. That is, mode stability can be achieved even in consideration of the dynamics of the laser.

In this embodiment, the reflectance of the wavelength tunable mirror 7 at the reflection peak wavelength is preferably 50% or more. On the wavelength tunable mirror 7, wavelength-independent reflection may exist in a small amount at a wavelength other than the reflection peak wavelength. This may be a factor that hinders wavelength tuning operation and unstabilizes the laser oscillation mode. It is therefore necessary in this embodiment that wavelength-independent reflection be reduced to such an extent that the influence of the reflection is sufficiently negligible. It is therefore preferable that the wavelength-independent reflectance be 1/10 or less that at the reflection peak wavelength. That is, in this embodiment, the wavelength-independent reflectance is preferably 5% or less.

This embodiment allows the respective elements constituting the external cavity 20 to be arranged to make a light beam linearly travel in order to minimize the effective length nL of the external cavity 20.

In addition, this embodiment does not use any narrow-band filter like a wavelength selection filter, and hence allows easy frequency modulation, resulting in high laser FM modulation efficiency. This makes it possible to implement a laser which can minimize loss due to stimulated Brillouin scattering in the optical fiber.

Note that in this embodiment, loss at the wavelength tunable mirror 7 can be further reduced by making the laser oscillation frequency (wavelength) perfectly coincide with the maximum reflection peak frequency (wavelength) of the wavelength tunable mirror 7. The phase adjustment area 3 provided in the external cavity is a mechanism for making these frequencies (wavelengths) coincide with each other.

Furthermore, in this embodiment, the reason why the reflectance of the low-reflection coating 4 on the optical output side is 1 to 10% is that when the reflectance is less than 1%, the laser threshold increases, and high optical power cannot be obtained, whereas when the reflectance is higher than 10%, the transmittance of the low-reflection coating 4 becomes less than 90%, and the optical power decreases.

Second Embodiment

Figure 4:
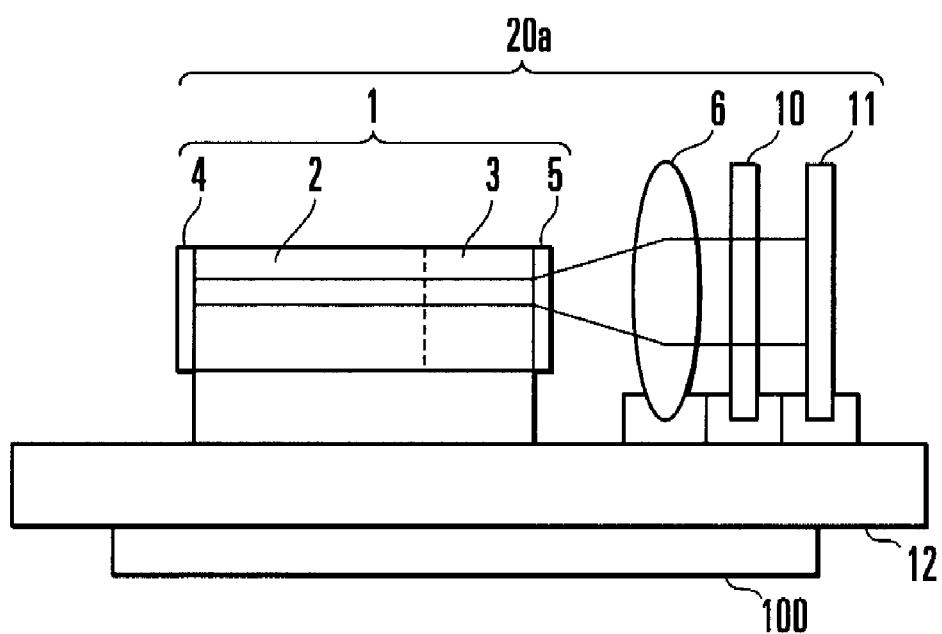
FIG. 4 is a side view showing the arrangement of an external cavity wavelength tunable laser device according to the second embodiment of the present invention.

The second embodiment of the present invention will be described next. FIG. 4 is a side view showing the arrangement of an external cavity wavelength tunable laser according to the second embodiment of the present invention. The same reference numerals as in FIG. 1 denote the same components in FIG. 4. The external cavity wavelength tunable laser of this embodiment comprises a semiconductor element 1 including a semiconductor optical amplifier 2, a collimating lens 6, a wavelength tunable filter 10 whose transmission characteristic within the operating wavelength band is not periodic, and a total reflection mirror 11.

This embodiment uses the wavelength tunable filter 10 and the total reflection mirror 11 instead of the wavelength tunable mirror 7 in the first embodiment. That is, an external cavity 20a comprises a low-reflection coating 4, the semiconductor optical amplifier 2, a phase adjustment area 3, a non-reflective coating 5, the collimating lens 6, the wavelength tunable filter 10, and the total reflection mirror 11. Referring to FIG. 4, reference numeral 12 denotes a subcarrier on which the respective elements constituting the external cavity 20a are mounted.

As in the first embodiment, the collimating lens 6 converts light beams from the semiconductor element 1 into parallel light. The light beam collimated by the collimating lens 6 is transmitted through the wavelength tunable filter 10, reflected by the total reflection mirror 11, and fed back to the semiconductor element 1.

The basic principle of this embodiment can be explained by using FIGS. 2A, 2B, and 2C like that of the first embodiment. In the first embodiment, reference numeral 21 in FIG. 2A denotes the reflection spectrum of the wavelength tunable mirror. In this embodiment, the ordinate of FIG. 2A represents transmittance, and reference numeral 21 in FIG. 2A denotes the transmission spectrum of the wavelength tunable filter 10.

Therefore, reference numeral 22 in FIG. 2A denotes a transmission band full width half maximum (FWHM) as a spectrum width at an intensity ½ the transmission peak. The total reflection mirror 11 has no frequency dependency, and hence requires no special consideration.

The laser mode selection principle of this embodiment can be explained in the same manner as in the first embodiment. In this embodiment, however, the distance from the left end face of the semiconductor optical amplifier 2 of the semiconductor element 1 to the total reflection mirror 11 can be calculated as an effective external cavity length nL according to equation (2). Other points can be explained in the same manner as in the first embodiment, and hence a repetitive description will be omitted. If the FWHM of the wavelength tunable filter 10 is 100 GHz and the external cavity length is 5 mm, the Fabry-Perot mode interval is about 20 GHz. Therefore, the Fabry-Perot mode interval is ⅕ times the FWHM of the wavelength tunable filter 10. It is therefore obvious from FIG. 3 that a sub-mode suppression ratio of 45 dB or more can be obtained.

In this embodiment, the wavelength tunable filter 10 is preferably not placed perfectly perpendicular to the direction of a light beam transmitted through it. This is because unnecessary reflected light from the surface of the wavelength tunable filter 10 returns to the semiconductor element 1 to disturb external cavity laser oscillation modes. This problem is typically noticeable when this laser device uses the wavelength tunable filter 10 whose transmission characteristic in the operating wavelength band is not periodic. The wavelength tunable filter 10 exhibits nonperiodic transmission peaks within the operating wavelength band. In general, however, a wavelength tunable filter using resonance has a similar transmission peak band outside the operating wavelength band. That is, the wavelength tunable filter 10 is a filter whose transmission peak periodically appears from the viewpoint of periods equal to more than the operating wavelength band.

If the Fabry-Perot mode interval is 1/10 times or more and 10 times or less the FWHM of the wavelength tunable filter 10 as in this embodiment, the transmission peak period is several ten times larger than the FWHM of the wavelength tunable filter 10. For example, the FWHM of the wavelength tunable filter 10 is 100 GHz, and the transmission peak period is 5 THz. In order to implement a wavelength tunable filter with an FWHM of 100 GHz with respect to a period of 5 THz, it is conceivable to use, for example, the micro-etalon disclosed in reference 10. The surface reflectance of the micro-etalon is 99% or more. This surface reflectance is much higher than that of an etalon used as a general wavelength selection filter, which is, for example, 50%. This worsens the problem caused when reflected light from the surface reflected light returns to the semiconductor element 1.

In this embodiment, therefore, in order to avoid such a problem, the wavelength tunable filter 10 is tilted from the vertical direction with respect to the optical axis. Tilting the surface of the wavelength tunable filter 10 from the vertical direction with respect to the optical axis makes it possible to prevent unnecessary reflected light from the surface of the wavelength tunable filter 10 from returning to the semiconductor optical amplifier 2 and disturbing external cavity laser oscillation modes. It is necessary to tilt the surface from the vertical direction by an angle of 0.1° or more in order to prevent light from being coupled to the semiconductor element 1. As this angle increases, the loss increases. It is therefore appropriate to set the maximum angle to 2°.

Note that when the wavelength tunable filter 10 is shifted from the vertical direction with respect to the optical axis by 0.1 to 2°, an angle variation occurs unless adjustment is made in particular. This angle variation has a great influence, and causes a case in which the laser oscillation mode does not coincide with the transmission peak frequency (wavelength) of the wavelength tunable filter 10.

In contrast to this, in this embodiment, the phase adjustment area 3 provided in the external cavity can make the laser oscillation frequency perfectly coincide with the transmission peak frequency of the wavelength tunable filter 10. This can absorb variations in the angle of the wavelength tunable filter 10 and obviate the necessity to accurately adjust the angle of the wavelength tunable filter 10. This makes it possible to reduce the assembly cost.

Figure 5:
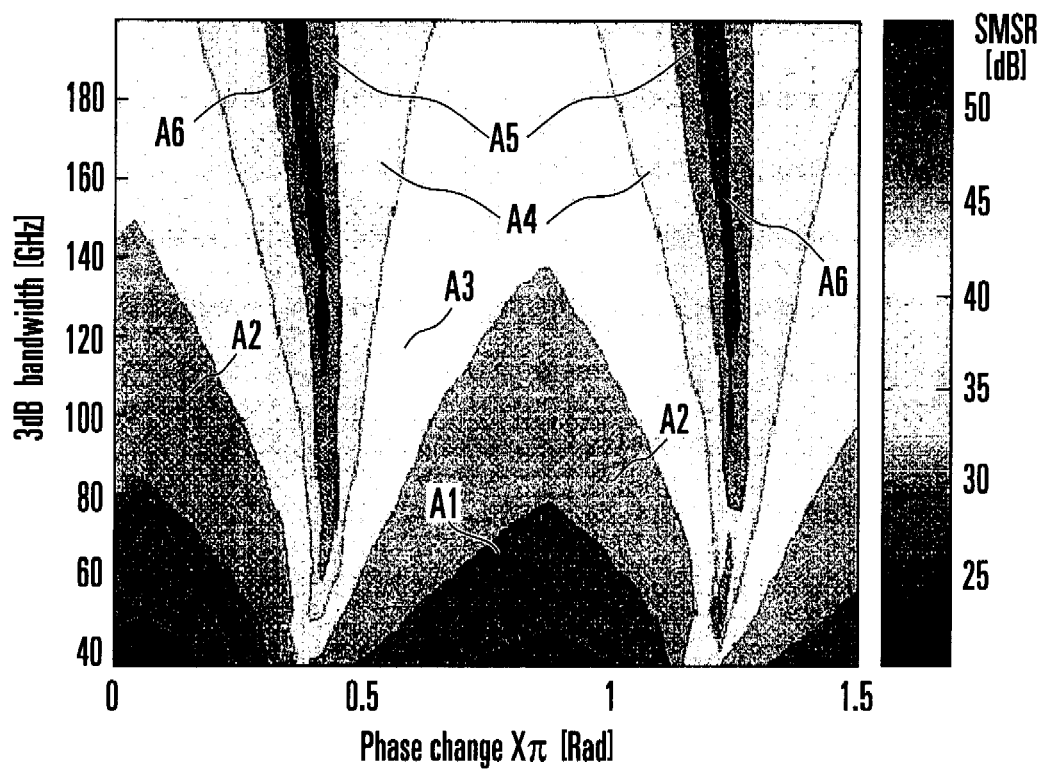
FIG. 5 is a graph showing the relationship between the transmission band full width half maximum of a wavelength tunable filter with respect to a phase adjustment amount and a sub-mode suppression ratio in the second embodiment of the present invention.

For reference, FIG. 5 shows how the sub-mode suppression ratio (SMSR) changes by phase adjustment with respect to the FWHM (3-dB band) of the wavelength tunable filter 10 when the Fabry-Perot mode interval of the external cavity laser is 22 GHz. Referring to FIG. 5, reference symbol A1 denotes an area with an SMSR of 50 [dB]; A2, an area with an SMSR of 45 [dB]; A3, an area with an SMSR of 40 [dB]; A4, an area with an SMSR of 35 [dB]; A5, an area with an SMSR of 30 [dB]; and A6, an area with an SMSR of 25 [dB]. According to FIG. 5, as the FWHM of the wavelength tunable filter 10 decreases, higher sub-mode suppression ratios can be easily obtained. This applies to the wavelength tunable mirror 7 in the first embodiment.

Third Embodiment

Figure 6:
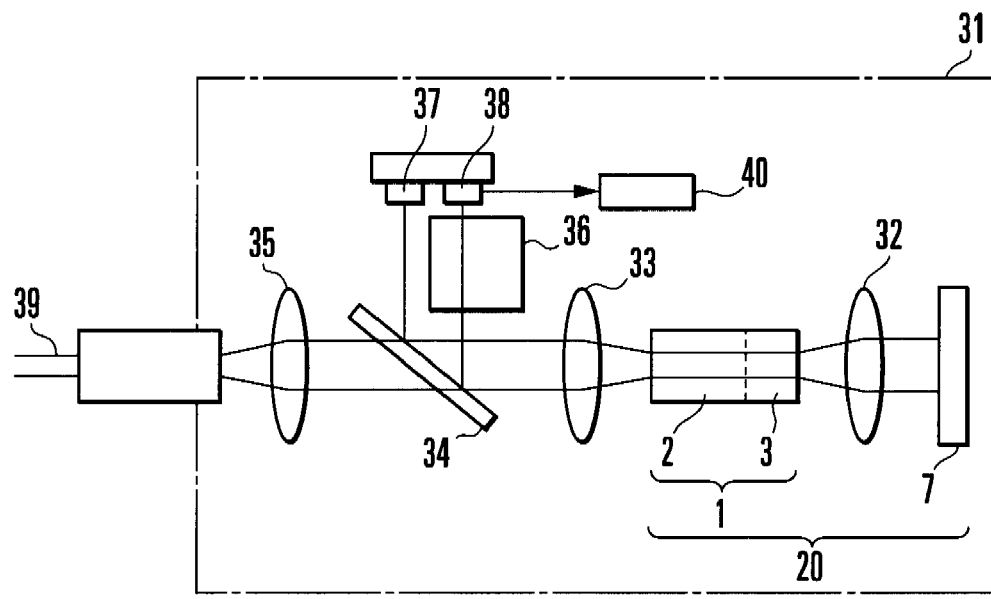
FIG. 6 is a plan view showing the arrangement of an external cavity wavelength tunable laser module according to the third embodiment of the present invention.

The third embodiment of the present invention will be described next. FIG. 6 is a side view showing the arrangement of an external cavity wavelength tunable laser according to the third embodiment of the present invention. The same reference numerals as in FIG. 1 denote the same components in FIG. 6. In the first embodiment, the known wavelength locker mechanism disclosed in reference 2 can be placed outside the laser cavity. This can improve the wavelength accuracy with respect to the standard channel wavelength. In the third embodiment, the external cavity wavelength tunable laser of the first embodiment is incorporated in a module, and a wavelength locker is placed on the optical output side.

Referring to FIG. 6, reference numeral 1 denotes a semiconductor element; 2, a semiconductor optical amplifier; 3, a phase adjustment area; 7, a wavelength tunable mirror; 20, an external cavity; 31, an external cavity wavelength tunable laser module; 32, a first collimating lens (the collimating lens 6 in FIG. 1); 33, a second collimating lens; 34, a partial reflection mirror; 35, a third collimating lens; 36, a wavelength locker made of an etalon; 37, a first photoelectric conversion element; 38, a second photoelectric conversion element; 39, an optical fiber; and 40, an arithmetic circuit. Although not illustrated in FIG. 6, a low-reflection coating is formed on the left end face of the semiconductor optical amplifier 2, and a nonreflective coating is formed on the right end face of the phase adjustment area 3. In addition, a temperature controller 100 is not illustrated in FIG. 6.

As in the first embodiment, the collimating lens 32 converts light beams generated by the semiconductor element 1 into parallel light. The beam collimated by the collimating lens 32 is reflected by the wavelength tunable mirror 7 and fed back to the semiconductor element 1. The second collimating lens 33 converts the light beam emitting from the optical output side of the semiconductor element 1 into parallel light. Part of the light beam collimated by the second collimating lens 33 is reflected by the partial reflection mirror 34, and the remaining light is transmitted through it. The light transmitted through the partial reflection mirror 34 is guided to the optical fiber 39 via the third collimating lens 35.

Part of the light which is reflected by the partial reflection mirror 34 strikes the first photoelectric conversion element 37. The remaining light passes through the wavelength locker 36 and then strikes the second photoelectric conversion element 38. The wavelength locker 36 causes light having undergone a change in transmittance depending on the wavelength of the incident light to emit. The first and second photoelectric conversion elements 37 and 38 convert incident light into monitor currents. The monitor current from the first photoelectric conversion element 37 carries the optical power information of the laser at this time. The monitor current from the second photoelectric conversion element 38 carries information including both the optical power information of the laser at this time and the wavelength information of the light oscillated by the laser at this time.

The arithmetic circuit 40 extracts a signal component dependent on a wavelength variation from the monitor currents from the first and second photoelectric conversion elements 37 and 38. The arithmetic circuit 40 then refers to the spectrum data of the transmittance with respect to the wavelength stored in the arithmetic circuit, and obtains the wavelength of the light currently oscillated by the laser, thereby generating the difference between the current wavelength and the standard channel wavelength which is a stability target as a wavelength dither signal. Since the oscillation wavelength of the laser generally depends on an injection current and a temperature, the arithmetic circuit 40 can make the oscillation wavelength of the laser coincide with the standard channel wavelength by feeding back this wavelength dither signal to either or both of an injection current adjusting means (not shown) of the laser and the temperature controller 100.

Figure 7A:
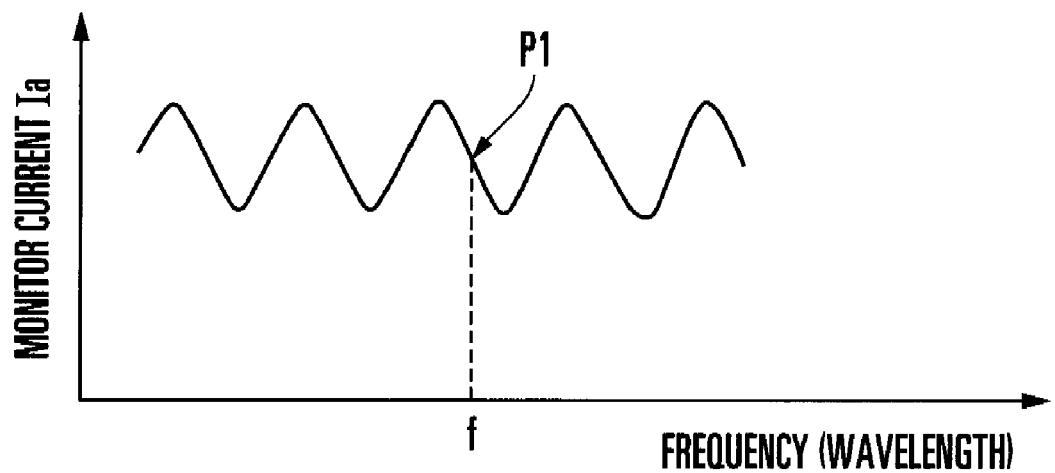
FIG. 7A is a graph for explaining the operation principle of a wavelength locker in the third embodiment of the present invention, showing the relationship between frequency and monitor current in the wavelength locker when the wavelength locker is placed outside a laser cavity.
Figure 7B:
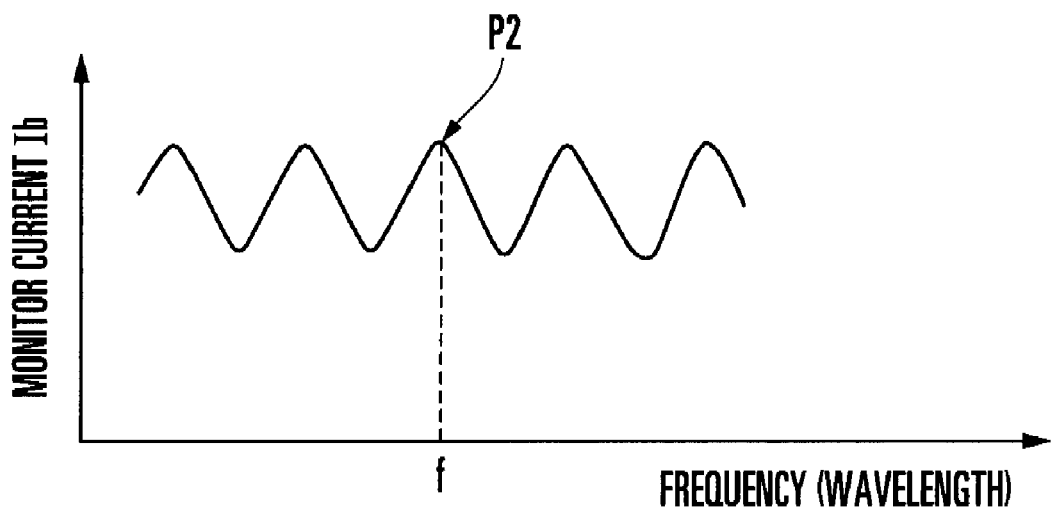
FIG. 7B is a graph for explaining the operation principle of a wavelength locker in the third embodiment of the present invention, showing the relationship frequency and monitor current in the wavelength locker when the wavelength locker is placed inside an external cavity.

For reference, FIGS. 7A and 7B show the operation principle of the wavelength locker 36. Reference symbol P1 in FIG. 7A denotes a wavelength locker operating point. Reference symbol P2 in FIG. 7B denotes a wavelength locking point. Reference symbol f in FIGS. 7A and 7B denotes a laser oscillation frequency. If the wavelength locker 36 is placed outside the laser cavity, the wavelength locker can be operated at the middle of the amplitude of a monitor current (a monitor current from the second photoelectric conversion element 38) Ia of the wavelength locker, as shown in FIG. 7A. Therefore, a change amount $dIa/d\lambda$ ($\lambda$ is a wavelength) is large. On the other hand, if the wavelength locker is provided in the external cavity, since the wavelength locking point is at a peak position of a monitor current Ib, as shown in FIG. 7B, a change amount $dIb/d\lambda$ is smaller than that in FIG. 7A.

In this embodiment, the wavelength locker is applied to the first embodiment. However, the wavelength locker can be applied to the second embodiment.

Fourth Embodiment

Figure 8:
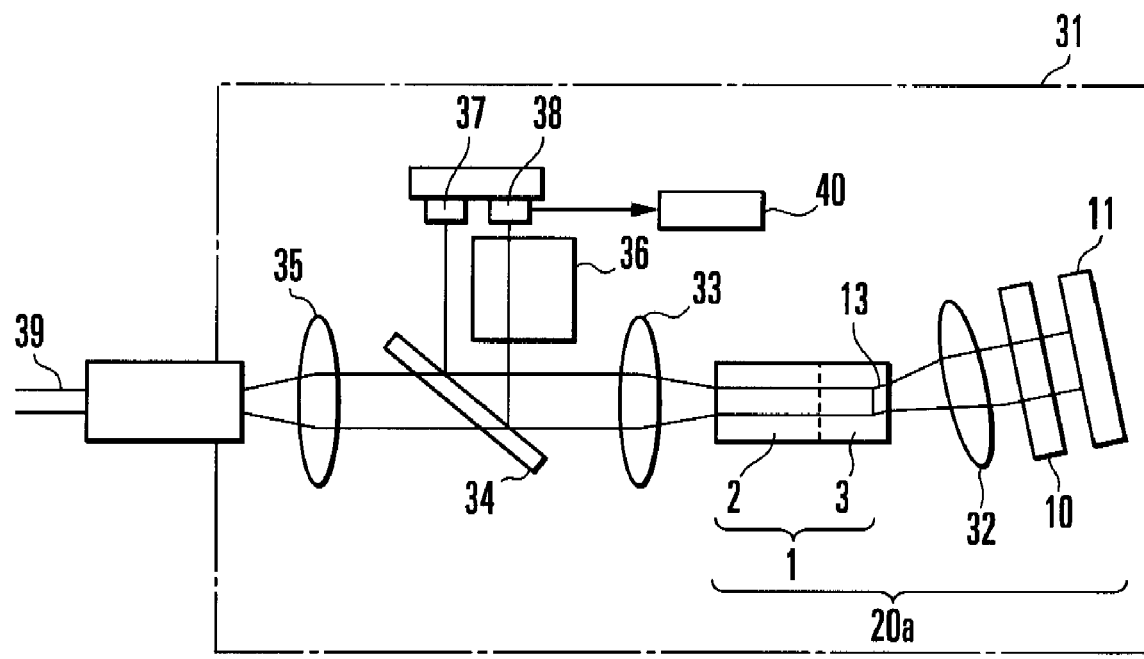
FIG. 8 is a plan view showing the arrangement of an external cavity wavelength tunable laser module according to the fourth embodiment of the present invention.

The fourth embodiment of the present invention will be described next. FIG. 8 is a side view showing the arrangement of an external cavity wavelength tunable laser module according to the fourth embodiment of the present invention. The same reference numerals as in FIGS. 4 and 6 denote the same components in FIG. 8. In this embodiment, the external cavity wavelength tunable laser of the second embodiment is incorporated in a module, a wavelength locker is placed on the optical output side, and a known inclined end face waveguide is provided on the right end face of the semiconductor element 1.

Referring to FIG. 8, reference numeral 1 denotes a semiconductor element; 2, a semiconductor optical amplifier; 3, a phase adjustment area; 10, a wavelength tunable filter; 11, a total reflection mirror; 13, an inclined end face waveguide (optical waveguide); 20a, an external cavity; 31, an external cavity wavelength tunable laser module; 32, a first collimating lens, 33, a second collimating lens; 34, a partial reflection mirror; 35, a third collimating lens; 36, a wavelength locker made of an etalon; 37, a first photoelectric conversion element; 38, a second photoelectric conversion element; 39, an optical fiber; and 40, an arithmetic circuit. A low-reflection coating is formed on the left end face of the semiconductor optical amplifier 2, and a nonreflective coating is formed on the right end face of the inclined end face waveguide 13, although they are not illustrated in FIG. 8 In addition, a temperature controller 100 is not illustrated in FIG. 8.

Since the operation of the external cavity wavelength tunable laser module of this embodiment is the same as that in the second and third embodiments, a detailed description thereof will be omitted.

In this embodiment, using the known inclined end face waveguide 13 can make light emit from the right end face of the semiconductor element 1 at an angle shifted from the vertical direction. This makes it possible to further reduce the reflectance of the low-reflection coating on the right end face of the semiconductor element 1 in effect. This can reduce the disturbance to external cavity laser oscillation modes and further improve the mode stability. Note that the inclined end face waveguide 13 may be applied to the first embodiment.

In this embodiment, the reflectance of the end face of the semiconductor optical amplifier 2 or phase adjustment area 3 which is located on the opposite side to the wavelength tunable mirror 7 or the wavelength tunable filter 10 can be further reduced in effect by placing the inclined end face waveguide 13 on the end face of the semiconductor optical amplifier 2 or phase adjustment area 3 which faces the wavelength tunable mirror 7 or the wavelength tunable filter 10 such that the waveguide is obliquely crosses the end face. Therefore, this can reduce the disturbance to external cavity laser oscillation modes and further improve the mode stability.

Fifth Embodiment

Figure 9:
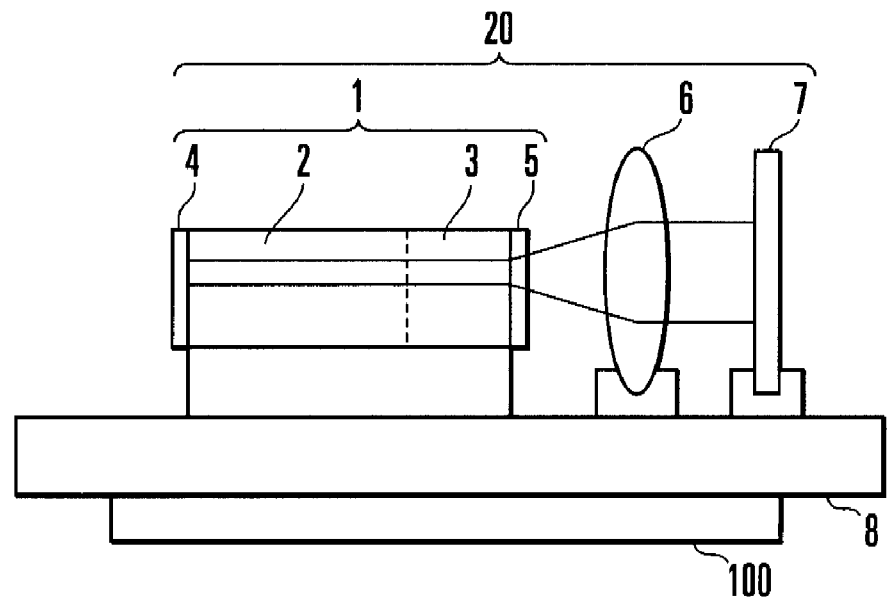
FIG. 9 is a side view showing the arrangement of an external cavity wavelength tunable laser device according to the fifth embodiment of the present invention.

The fifth embodiment of the present invention will be described next. FIG. 9 is a side view showing the arrangement of an external cavity wavelength tunable laser according to the fifth embodiment of the present invention. As shown in FIG. 9, a cavity length nL of the external cavity wavelength tunable laser is defined by the distance from the exit side end face of a semiconductor optical amplifier 2 to a wavelength tunable mirror 7. Therefore, as described above, a Fabry-Perot mode interval Δvcav is expressed by equation (3). This embodiment is characterized in that the wavelength tunable mirror 7 is placed to set the effective length nL which satisfies a condition for making an integer multiple of the Fabry-Perot mode interval Δvcav be equal to the standard channel interval. Other portions conform to the first to fourth embodiments.

For example, in consideration of a system with a channel interval of 50 GHz, Fabry-Perot mode interval Δvcav=12.5 GHz can be set. Fabry-Perot mode interval Δvcav=12.5 GHZ is achieved as follows. The refractive index of a semiconductor element 1 is set to n1=3.5, the length of the semiconductor element 1 is set to L1=0.8 mm, the refractive index of the space between the semiconductor element 1 and a collimating lens 6 is set to n2=1, the length of the space is set to L2=0.6 mm, the refractive index of the collimating lens 6 is set to n3=1.5, the length of the collimating lens 6 is set to L3=1 mm, the refractive index of the space between the collimating lens 6 and the wavelength tunable mirror 7 is set to n4=1, and the length of the space is set to L4=7.1 mm. In this case, the effective length of the external cavity 20 is set to nL=12 mm. According to equation (3), if a light velocity C is 300,000 km/s, Fabry-Perot mode interval Δvcav=12.5 GHz.

The laser oscillation modes in this case will be described with reference to FIGS. 10A, 10B, 10C, and 10D. FIG. 10A is a graph showing the reflection characteristic of the wavelength tunable mirror 7. FIG. 10B is a graph showing the Fabry-Perot modes of an external cavity 20. FIG. 10C is a graph showing the laser oscillation modes of the external cavity 20. FIG. 10C is a graph showing a channel interval. Reference numeral 80 denotes the reflection spectrum of the wavelength tunable mirror 7; 81, the reflection spectrum of the wavelength tunable mirror 7 after wavelength tuning operation; 82, a Fabry-Perot mode; 84, a standard channel; 85, a laser oscillation mode; 86, a laser oscillation mode after wavelength tuning operation; and 87 and 88, channels. Reference symbol f1 denotes the reflection peak frequency of the wavelength tunable mirror 7; f2, the reflection peak frequency of the wavelength tunable mirror 7 after wavelength tuning operation; and CI, a channel interval.

FIGS. 11A, 11B, 11C, and 11D show, as an example of the prior art, the case of a conventional external cavity wavelength tunable laser which does not satisfy the condition for making an integer multiple of the Fabry-Perot mode interval Δvcav be equal to the standard channel interval. FIG. 11A is a graph showing the reflection characteristic of the wavelength tunable mirror 7. FIG. 11B is a graph showing the Fabry-Perot modes of an external cavity. FIG. 11C is a graph showing the laser oscillation modes of the external cavity. FIG. 11C is a graph showing a channel interval. Reference numeral 92 denotes a Fabry-Perot mode; 95, a laser oscillation mode; and 96, a laser oscillation mode after wavelength tuning operation. Assume that the length of the space between the collimating lens 6 and the wavelength tunable mirror 7 is L4=2.24 mm and the length and refractive index of the other space are the same as in the case shown in FIGS. 10A, 10B, 10C, and 10D. In the case shown in FIGS. 11A, 11B, 11C, and 11D, Fabry-Perot mode interval Δvcav=21 GHz according to equation (3).

The function and effect of this embodiment will be described with reference to FIGS. 10A, 10B, 10C, and 10D and FIGS. 11A, 11B, 11C, and 11D.

If Fabry-Perot mode interval Δvcav=12.5 GHz, the Fabry-Perot mode interval Δvcav is precisely ¼ a channel interval of 50 GHz. This indicates that all channels are under the same phase condition. If, therefore, phase adjustment can be made according to a channel wavelength in one of the channels by initial setting, it is not necessary to perform phase adjustment in all the channels. That is, if the Fabry-Perot mode 82 is phase-adjusted in the reflection spectrum 80 of the wavelength tunable mirror 7 shown in FIG. 10A to make one of the Fabry-Perot modes coincide with the channel 87 in FIG. 10D, the laser oscillation mode 85 shown in FIG. 10C can be obtained. When the wavelength tunable mirror 7 is made to perform wavelength tuning operation to move the reflection spectrum of the wavelength tunable mirror 7 to the reflection spectrum 81, there is no need to adjust the Fabry-Perot mode 82 any more, and the laser oscillation mode 86 shown in FIG. 10c is obtained in the channel 88 shown in FIG. 10D.

In the case shown in FIGS. 11A, 11B, 11C, and 11D, Fabry-Perot mode interval Δvcav=21 GHz, and hence an integer multiple of the Fabry-Perot mode interval Δvcav cannot be a channel interval of 50 GHz. In the conventional external cavity wavelength tunable laser, no consideration has been given to the Fabry-Perot mode interval Δvcav. Assume that after the laser oscillation mode 95 shown in FIG. 11C is obtained by phase-adjusting the Fabry-Perot mode 92 in the reflection spectrum 80 of the wavelength tunable mirror 7 shown in FIG. 11A so as to make one of the Fabry-Perot modes coincide with the channel 87 shown in FIG. 11D, the wavelength tunable mirror 7 is further made to perform wavelength tuning operation to move the reflection spectrum of the wavelength tunable mirror 7 to the reflection spectrum 81 in FIG. 11A. In this case, a wavelength shift D occurs between the laser oscillation mode 96 and the channel 88, as shown in FIGS. 11C and 11D, and hence it is necessary to make one of the Fabry-Perot modes 92 coincide with the standard channel wavelength by performing phase adjustment again.

In this embodiment, the unnecessity of phase adjustment indicates that phase adjustment is almost unnecessary but slight phase adjustment is permitted. This is because slight phase adjustment may be required to improve the wavelength accuracy with respect to the standard channel. Assume therefore that the definition of phase adjustment unnecessity includes phase adjustment up to about ±π/4 throughout all the channels.

This embodiment exemplifies the case in which the feature is applied to the arrangement of the first embodiment. However, the embodiment can also be applied to the arrangement of the second embodiment using the wavelength tunable filter 10 and the total reflection mirror 11 instead of the wavelength tunable mirror 7. If the embodiment is applied to the second embodiment, an integer multiple of the Fabry-Perot mode interval Δvcav can be made to be equal to the standard channel interval by positioning the total reflection mirror 11. When the embodiment is applied to the second embodiment, the same function and effect as those described can be obtained. Therefore, a detailed description of this will be omitted.

In addition, in this embodiment, Fabry-Perot mode interval Δvcav=25 GHz can also be set. In this case, the Fabry-Perot mode interval Δvcav is ½ a standard channel interval of 50

GHz, and the same effect as that in the case in which Fabry-Perot mode interval Δνcav=12.5 GHz can be obtained. That is, if one of the phase conditions is matched by initial setting, it is not necessary to perform phase adjustment in all the channels. This effect is the same as that described above.

In this embodiment, the set values of phases in all the channels in a wavelength tuning range can be made to be equal to each other by placing the total reflection mirror 11 or the wavelength tunable mirror 7 to make an integer multiple of the Fabry-Perot mode interval Δνcav be equal to the channel interval on the frequency axis. This makes it possible to obviate the necessity to perform phase adjustment for all the channels after phase adjustment is performed once in initial setting.

Figure 12:
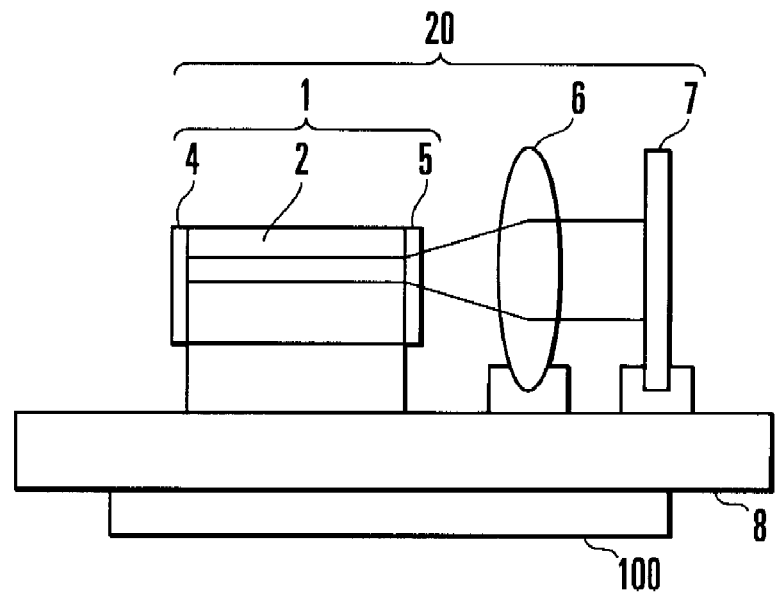
FIG. 12 is a side view showing the arrangement of an external cavity wavelength tunable laser device according to the fifth embodiment of the present invention from which a phase adjustment area is omitted.
Figure 13:
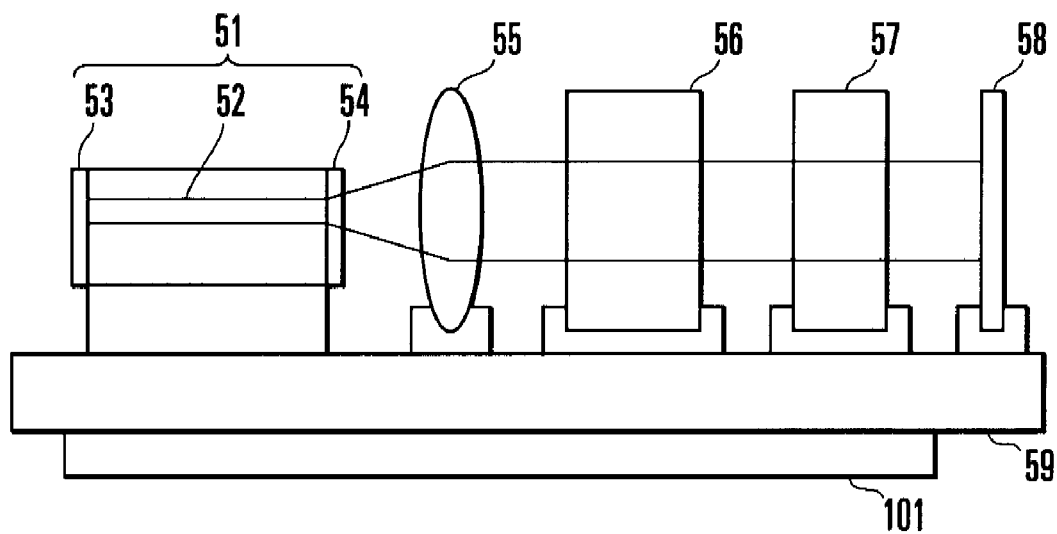
FIG. 13 is a side view showing the arrangement of a conventional external cavity wavelength tunable laser device.

If phase adjustment is made unnecessary in this manner, the phase adjustment area 3 can be omitted from the semiconductor element 1. FIG. 12 shows the arrangement of an external cavity wavelength tunable laser from which the phase adjustment area 3 is omitted. Omitting the phase adjustment area 3 can reduce the cost of the semiconductor element 1. In addition, if phase adjustment is made unnecessary, since the control circuit arrangement can be simplified, wavelength control operation can be simplified. This can reduce the cost of the apparatus including the control circuit. In addition, obviating the necessity of phase adjustment makes it possible to increase the wavelength tuning speed.

Even if the phase adjustment area 3 is omitted, it is necessary to perform phase adjustment once as initial setting. Using a technique of adjusting the temperature of the semiconductor element 1 as a technique for this operation makes it possible to adjust a refractive index n1 of the semiconductor element 1. The adjustment of the refractive index n1 of the semiconductor element 1 can also be used to improve the wavelength accuracy with respect to the standard channel.

In addition, this embodiment includes a condition which can be used without changing the laser arrangement even when the channel interval in this system is changed. This condition will be described in detail below.

As the standard channel interval used for optical communication is decreased by ½ like 200 GHz, 100 GHz, 50 GHz, and 25 GHz, the number of channels in the same band can be increased. Such operation is performed to allow conventional channels to be used without any change even if upgrading such as an increase in the number of channels is made. In this embodiment, if the Fabry-Perot mode interval Δνcav which satisfies equation (4) given below is set, it is possible to obtain the effect of obviating the necessity of phase adjustment without any change of the laser arrangement even if the system is upgraded to use channels at short intervals. In addition, since only one type of laser is required, the cost for inventory taking can be reduced.

$$\Delta\nu cav \times 2^M = 100 \text{ GHz} \quad (4)$$

In equation (4), M is an integer, and $2^M$ indicates Mth power of 2. A case in which M=3 will be described. If M=3, Fabry-Perot mode interval Δνcav=12.5 GHz. In this case, integer multiples of the Fabry-Perot mode interval Δνcav become equal to the channel intervals in all the systems like Δνcav×8=100 GHz, Δνcav×4=50 GHz, and Δνcav×2=25 GHz. When M=2 and Fabry-Perot mode interval Δνcav=25 GHz, an integer multiple of the Fabry-Perot mode interval Δνcav is also equal to the channel interval. Therefore, satisfying equation (4) makes it unnecessary to always perform phase adjustment for a system using channels at short intervals.

The same explanation can be applied to a case in which M is 4 or more. Obviously, as M increases, the Fabry-Perot mode interval Δνcav decreases while satisfying equation (4). That is, a larger value of M can be used for systems with channels at shorter intervals.

Placing the total reflection mirror 11 or wavelength tunable mirror 7 so as to make the Mth power of 2 of the Fabry-Perot mode interval Δνcav become equal to the channel interval on the frequency axis in the above manner makes it possible to apply the present invention to the system without changing the laser arrangement even if the channel interval width in the system is upgraded to ½ or ¼.

Note that in a case of M=1, Fabry-Perot mode interval Δνcav=50 GHz, and hence the present invention cannot be applied to a system with a channel interval of 25 GHz. The sixth embodiment described below solves such a problem associated with this arrangement.

Sixth Embodiment

The sixth embodiment of the present invention will be described next. The arrangement of this embodiment conforms to that of the fifth embodiment, and hence will be described with reference to FIG. 9. The fifth embodiment has described the effect of obviating the necessity of phase adjustment. This indicates that the phase set value is constant in all the channels. That is, the phase set value is a single value. In contrast, this embodiment exemplifies an arrangement using a limited number of phase set values, i.e., two, three, or four values, in all the channels.

Assume that M=1 in equation (4). In this case, Fabry-Perot mode interval Δνcav=50 GHz. In a system with a channel interval of 25 GHz, if there is only one phase set value, a phase condition can be satisfied only for every other channel. Obviously, however, phase-adjusting a Fabry-Perot mode interval Δνcav by half a period can satisfy the phase condition in all channels in which the phase condition cannot be satisfied otherwise. This is because all the channels which do not coincide with Fabry-Perot mode interval Δνcav 50 GHz are shifted by Δνcav/2. That is, in case of M=1 in equation (4), simply preparing two phase set values can perform phase adjustment in accordance with the wavelengths of all the channels.

In a similar case, a laser device with Fabry-Perot mode interval Δνcav=20 GHz may be applied to a system with a channel interval of 50 GHz. In this case as well, setting 100-GHz intervals can obviate the necessity of phase adjustment. When, therefore, the device is applied to 50-GHz intervals, two phase set values are required. Consider a similar case in which Fabry-Perot mode interval Δνcav=16.666 GHz and channel interval=25 GHz. In this case, setting 50-GHz intervals can obviate the necessity of phase adjustment like Δνcav×3=50 GHz. When, therefore, this device is applied to 25-GHz intervals, two set values for phase adjustment are required.

In this manner, only two phase set values can be used. In addition, as will be described below, an arrangement using three or four set values can be formed. Assume that Fabry-Perot mode interval Δνcav=14.286 GHz and channel interval=25 GHz. In this case, since Δνcav×7=100 GHz, a phase set value coincides with a channel interval for every 100 GHz. Therefore, preparing four phase set values for a system with 25-GHz intervals makes it possible to set all channels.

If, however, the number of phase set values is too large, the effect of simplifying the control circuit is reduced. In practice, therefore, the appropriate number of phase set values is four or less.

In this embodiment, since the number of phase set values in all channels is limited to four or less, the effect of simplifying the arrangement of the control circuit as compared with the prior art can conform to the fifth embodiment.

Note that in the first to sixth embodiments, when the wavelength tunable mirror 7 or the wavelength tunable filter 10 is formed into a nonmechanical component without any movable parts, the external cavity can be operated stably against external disturbances.

In the first to sixth embodiments, when the wavelength tuning range of the external cavity wavelength tunable laser device is set to one of the C-band, L-band, and S-band in optical filter communication or the sum of at least two bands of them, since the band which can be amplified by the optical fiber amplifier can be used, long-distance communication beyond 100 km can be performed.

According to the first to sixth embodiments, placing the phase adjustment area 3, which can effectively change the optical path length by changing the refractive index, inside the external cavity 20 can make the laser oscillation frequency perfectly coincide with the maximum reflection peak frequency of the wavelength tunable mirror 7. This makes it possible to further reduce loss at the wavelength tunable mirror 7. In addition, in the first to sixth embodiments, since the laser oscillation frequency can be made to perfectly coincide with the transmission peak frequency of the wavelength tunable filter 10 by placing the phase adjustment area 3 inside the external cavity 20a, variations in the angle of the wavelength tunable filter 10 can be absorbed. This obviates the necessity to perform angle adjustment for the wavelength tunable filter 10 with high accuracy.

Furthermore, according to the first to sixth embodiments, the external cavity 20 or 20a can be reduced in size by placing the respective constituent elements of the external cavity 20 or 20a so as to make a light beam linearly travel inside the external cavity. This facilitates physical placement for achieving a desired cavity mode interval even in an actual implementation step.

Note that in the first to sixth embodiments, an adjustment mechanism which adjusts the laser beam output amount may be provided outside the external cavity 20 or 20a.

INDUSTRIAL APPLICABILITY

The present invention can be applied to medium/long-distance light sources for wavelength division multiplexing communication used in a trunk system, metro system, and access system.

The invention claimed is:

1. An external cavity wavelength tunable laser device characterized by comprising:
    an external cavity which includes a semiconductor optical amplifier and performs laser oscillation operation by feeding back external light; and
    a wavelength tunable mirror which is placed on one end of said external cavity and has at least a single peak reflection spectrum characteristic within a laser wavelength tuning range,
    wherein a Fabry Perot mode interval determined by an effective length of said external cavity is not less than $1/10$ times and not more than 10 times a reflection band full width half maximum of said wavelength tunable mirror.

2. An external cavity wavelength tunable laser device characterized by comprising:
    an external cavity which includes a semiconductor optical amplifier and a total reflection mirror which performs laser oscillation operation by feeding back external light; and
    a transmitting wavelength tunable filter which is placed between the semiconductor optical amplifier and the total reflection mirror and has at least a single peak transmission spectrum characteristic within a laser wavelength tuning range,
    wherein a Fabry Perot mode interval determined by an effective length of said external cavity is not less than $1/10$ times and not more than 10 times a transmission band full width half maximum of said wavelength tunable filter.

3. An external cavity wavelength tunable laser device according to claim 2, characterized in that a surface of said wavelength tunable filter which laser light strikes and from which laser light exits is tilted from a vertical direction with respect to an optical axis.

4. An external cavity wavelength tunable laser device according to claim 1, characterized in that a Fabry Perot mode interval determined by the effective length of said external cavity is not less than $1/2$ times the reflection band full width half maximum of said wavelength tunable mirror.

5. An external cavity wavelength tunable laser device according to claim 2, characterized in that a Fabry Perot mode interval determined by the effective length of said external cavity is not less than $1/2$ times the transmission band full width half maximum of said wavelength tunable filter.

6. An external cavity wavelength tunable laser device according to claim 1, characterized in that said wavelength tunable mirror is of a nonmechanical type without any movable parts.

7. An external cavity wavelength tunable laser device according to claim 2, characterized in that said wavelength tunable filter is of a nonmechanical type without any movable parts.

8. An external cavity wavelength tunable laser device according to claim 1, characterized in that the wavelength tuning range is one of a C band, L band, and S band in optical fiber communication or a sum of at least two bands thereof.

9. An external cavity wavelength tunable laser device according to claim 2, characterized in that the wavelength tuning range is one of a C band, L band, and S band in optical fiber communication or a sum of at least two bands thereof.

10. An external cavity wavelength tunable laser device according to claim 1, characterized by further comprising, inside said external cavity, a phase adjustment area which is configured to effectively change an optical path length by changing a refractive index.

11. An external cavity wavelength tunable laser device according to claim 2, characterized by further comprising, inside said external cavity, a phase adjustment area which is configured to effectively change an optical path length by changing a refractive index.

12. An external cavity wavelength tunable laser device according to claim 10, characterized in that the phase adjustment area is integrally formed with the semiconductor optical amplifier.

13. An external cavity wavelength tunable laser device according to claim 11, characterized in that the phase adjustment area is integrally formed with the semiconductor optical amplifier.

14. An external cavity wavelength tunable laser device according to claim 1, characterized in that constituent elements constituting said external cavity are arranged to make a light beam linearly travel inside said external cavity.

15. An external cavity wavelength tunable laser device according to claim 2, characterized in that constituent elements constituting said external cavity are arranged to make a light beam linearly travel inside said external cavity.

16. An external cavity wavelength tunable laser device according to claim 1, characterized by further comprising an optical waveguide provided on an end face of the semiconductor optical amplifier which faces said wavelength tunable mirror such that said optical waveguide obliquely crosses the end face.

17. An external cavity wavelength tunable laser device according to claim 2, characterized by further comprising an optical waveguide provided on an end face of the semiconductor optical amplifier which faces said wavelength tunable filter such that said optical waveguide obliquely crosses the end face.

18. An external cavity wavelength tunable laser device according to claim 10, characterized by further comprising an optical waveguide provided on an end face of said phase adjustment area which faces said wavelength tunable mirror such that said optical waveguide obliquely crosses the end face.

19. An external cavity wavelength tunable laser device according to claim 11, characterized by further comprising an optical waveguide provided on an end face of said phase adjustment area which faces said wavelength tunable filter such that said optical waveguide obliquely crosses the end face.

20. An external cavity wavelength tunable laser device according to claim 1, characterized in that a reflectance of a light exit side end face on an opposite side to the wavelength tunable mirror in the semiconductor optical amplifier is from 1 to 10%.

21. An external cavity wavelength tunable laser device according to claim 2, characterized in that a reflectance of a light exit side end face on an opposite side to the wavelength tunable filter in the semiconductor optical amplifier is from 1 to 10%.

22. An external cavity wavelength tunable laser device according to claim 1, characterized in that a wavelength independent reflectance of said wavelength tunable mirror is not more than 1/10 times a reflectance of said wavelength tunable mirror at a reflection peak wavelength.

23. An external cavity wavelength tunable laser device according to claim 1, characterized by further comprising, outside said external cavity, a wavelength locker mechanism which locks a laser oscillation wavelength.

24. An external cavity wavelength tunable laser device according to claim 2, characterized by further comprising, outside said external cavity, a wavelength locker mechanism which locks a laser oscillation wavelength.

25. An external cavity wavelength tunable laser device according to claim 1, characterized by further comprising, outside said external cavity, an adjustment mechanism which adjusts a laser optical output amount.

26. An external cavity wavelength tunable laser device according to claim 2, characterized by further comprising, outside said external cavity, an adjustment mechanism which adjusts a laser optical output amount.

27. An external cavity wavelength tunable laser device according to claim 1, characterized in that said wavelength tunable mirror is placed to make an integer multiple of the Fabry Perot mode interval become equal to a channel interval on a frequency axis.

28. An external cavity wavelength tunable laser device according to claim 2, characterized in that said total reflection mirror is placed to make an integer multiple of the Fabry Perot mode interval become equal to a channel interval on a frequency axis.

29. An external cavity wavelength tunable laser device according to claim 1, characterized in that said wavelength tunable mirror is placed to make an Mth (M is an integer) power of 2 of the Fabry Perot mode interval become equal to a channel interval on a frequency axis.

30. An external cavity wavelength tunable laser device according to claim 2, characterized in that the total reflection mirror is placed to make a product of $2^M$ (M is an integer) and the Fabry Perot mode interval become equal to a channel interval on a frequency axis.

31. An external cavity wavelength tunable laser device according to claim 27, characterized by further comprising, inside said external cavity, a phase adjustment area which is configured to effectively change an optical path length by changing a refractive index,
wherein the number of phase set values in said phase adjustment area is set to not less than 1 and not more than 4 within an entire wavelength tuning range.

32. An external cavity wavelength tunable laser device according to claim 28, characterized by further comprising, inside said external cavity, a phase adjustment area which is configured to effectively change an optical path length by changing a refractive index,
wherein not less than 1 and not more than 4 phase set values in said phase adjustment area are available within an entire wavelength tuning range.

33. An external cavity wavelength tunable laser device according to claim 29, characterized by further comprising, inside said external cavity, a phase adjustment area which is configured to effectively change an optical path length by changing a refractive index,
wherein not less than 1 and not more than 4 phase set values in said phase adjustment area are available within an entire wavelength tuning range.

34. An external cavity wavelength tunable laser device according to claim 30, characterized by further comprising, inside said external cavity, a phase adjustment area which is configured to effectively change an optical path length by changing a refractive index,
wherein not less than 1 and not more than 4 phase set values in said phase adjustment area are available within an entire wavelength tuning range.

35. An optical output module characterized by comprising:
at least an external cavity wavelength tunable laser device,
said external cavity wavelength tunable laser device including an external cavity which includes a semiconductor optical amplifier and performs laser oscillation operation by feeding back external light, and a wavelength tunable mirror which is placed on one end of said external cavity and has at least a single peak reflection spectrum characteristic within a laser wavelength tuning range,
wherein a Fabry Perot mode interval determined by an effective length of said external cavity is not less than 1/10 times and not more than 10 times a reflection band full width half maximum of said wavelength tunable mirror.

36. An optical output module characterized by comprising:
at least an external cavity wavelength tunable laser device,
said external cavity wavelength tunable laser device including an external cavity which includes a semiconductor optical amplifier and a total reflection mirror which performs laser oscillation operation by feeding back external light, and a transmitting wavelength tunable filter which is placed between the semiconductor optical amplifier and the total reflection mirror and has at least a single peak transmission spectrum characteristic within a laser wavelength tuning range,
wherein a Fabry Perot mode interval determined by an effective length of said external cavity is not less than 1/10 times and not more than 10 times a transmission band full width half maximum of said wavelength tunable filter.

* * * * *

UNITED STATES PATENT AND TRADEMARK OFFICE
CERTIFICATE OF CORRECTION

PATENT NO.         : 7,991,024 B2
APPLICATION NO.    : 11/994085
DATED              : August 2, 2011
INVENTOR(S)        : Kenji Sato et al.

Page 1 of 1

It is certified that error appears in the above-identified patent and that said Letters Patent is hereby corrected as shown below:

In the Specification

Column 2, Line 29: delete "a wavelength tunable mirror, and the like in the external cavity." and insert -- and the like in the external cavity and using a wavelength tunable mirror, and so on as the external reflecting mirror. --

Column 2, Line 37: delete "and a wavelength tunable mirror inserted in a cavity." and insert -- inserted in a cavity and a wavelength tunable mirror used as an external reflecting mirror. --

Column 2, Line 50: delete "external mirror" and insert -- external reflecting mirror --

Column 11, Line 66: delete "external mirror" and insert -- external reflecting mirror --

Column 19, Line 59: delete "Δvcav=4=50 GHz," and insert -- Δvcav×4=50 GHz, --

Signed and Sealed this
Twenty-ninth Day of April, 2014

Michelle K. Lee
*Deputy Director of the United States Patent and Trademark Office*